US012802925B2

(12) United States Patent
Sato

(10) Patent No.: US 12,802,925 B2
(45) Date of Patent: Nov. 17, 2026

(54) MARK POSITION MEASUREMENT APPARATUS, CHARGED PARTICLE BEAM WRITING APPARATUS, AND MARK POSITION MEASUREMENT METHOD

(71) Applicant: NuFlare Technology, Inc., Yokohama (JP)

(72) Inventor: Hiroshi Sato, Utsunomiya (JP)

(73) Assignee: NuFlare Technology, Inc., Yokohama (JP)

( * ) Notice: Subject to any disclaimer, the term of this patent is extended or adjusted under 35 U.S.C. 154(b) by 379 days.

(21) Appl. No.: 18/638,862

(22) Filed: Apr. 18, 2024

(65) Prior Publication Data

US 2024/0363307 A1 Oct. 31, 2024

(30) Foreign Application Priority Data

Apr. 25, 2023 (JP) ................................ 2023-071315

(51) Int. Cl.
*H01J 37/304* (2006.01)
*G01B 11/14* (2006.01)
(Continued)

(52) U.S. Cl.
CPC ............ *H01J 37/304* (2013.01); *G01B 11/14* (2013.01); *G01B 11/26* (2013.01); *H01J 37/3174* (2013.01); *H01J 2237/31754* (2013.01)

(58) Field of Classification Search
CPC ..... H01J 2237/31754; H01J 2237/3175; H01J 2237/216; H01J 37/3177; H01J 37/3174;
(Continued)

(56) References Cited

U.S. PATENT DOCUMENTS 6,411,386 B1 * 6/2002 Nishi .................... G01B 11/26
356/399
8,237,139 B2 8/2012 Sato
(Continued)

FOREIGN PATENT DOCUMENTS

CN 110783164 A 2/2020
JP 7-302741 A 11/1995
(Continued)

OTHER PUBLICATIONS

Korean Office Action issued Jul. 9, 2025 in Korean Patent Application No. 10-2024-0053841 (with unedited computer-generated English Translation), 8 pages.

*Primary Examiner* — Jason L Mccormack
(74) *Attorney, Agent, or Firm* — Oblon, McClelland, Maier & Neustadt, L.L.P.

(57) ABSTRACT

A mark-position-measurement-apparatus includes a stage with an object having plural marks thereon, a sensor including an irradiator irradiating beams to the object, and a photoreceiver receiving a reflected light from the object and outputting a height-position distribution of the object surface, a position-calculation-circuit to calculate, for each mark, a position of a mark-candidate-signal acquired in a scanned region, by using the height-position distribution, for each mark, obtained by scanning the beam over the plural marks to be intersected with one of the plural marks, a combination-generation-circuit to generate plural combinations by combining mark-candidate-signals selected from the plural marks when plural mark-candidate-signals are acquired, in a scanning direction, for at least one mark, and a selection-circuit to select a combination of mark-candidate-signals, being mark signals of the plural marks, from the plural combinations, by comparing, with a predeter-
(Continued)

mined reference value, relative position information regarding mark-candidate-signals in the same combination.

17 Claims, 22 Drawing Sheets

(51) Int. Cl.
*G01B 11/26* (2006.01)
*H01J 37/317* (2006.01)

(58) Field of Classification Search
CPC ..... H01J 37/3045; H01J 37/304; G01B 11/26; G01B 11/14
USPC .......................................... 250/306, 307, 398
See application file for complete search history.

(56) References Cited

U.S. PATENT DOCUMENTS

| | | | | |
|---|---|---|---|---|
| 2006/0119830 | A1* | 6/2006 | Ottens ................. | G03F 7/70516 355/77 |
| 2009/0078888 | A1 | 3/2009 | Namba et al. | |
| 2010/0309486 | A1 | 12/2010 | Numata et al. | |
| 2013/0101188 | A1* | 4/2013 | Sievers ................. | H01J 37/226 382/128 |
| 2014/0175279 | A1 | 6/2014 | Agemura | |
| 2014/0291512 | A1* | 10/2014 | Nakatani ............ | G01N 23/2251 250/442.11 |
| 2015/0097126 | A1 | 4/2015 | Mccord et al. | |
| 2016/0203948 | A1* | 7/2016 | Huynh ............... | H10N 60/0884 250/398 |
| 2020/0043705 | A1 | 2/2020 | Chen et al. | |

FOREIGN PATENT DOCUMENTS

| | | | |
|---|---|---|---|
| JP | 2002-110507 | A | 4/2002 |
| JP | 2003-86483 | A | 3/2003 |
| JP | 2010-267758 | A | 11/2010 |
| JP | 2010-283157 | A | 12/2010 |
| TW | 201816387 | A | 5/2018 |

* cited by examiner

[MEASUREMENT USING THREE MARKS]
THREE DISTANCES
THREE ANGLES

[MEASUREMENT USING FOUR MARKS]
SIX DISTANCES
TWELVE ANGLES

| COMBINATION | DISTANCE INDEX | ANGLE INDEX | PRIORITY |
|---|---|---|---|
| a1 | b1 | c1 | 1 |
| a2 | b1 | c2 | 2 |
| a3 | b2 | c3 | 3 |
| a4 | b3 | c3 | 4 |
| ⋮ | ⋮ | ⋮ | ⋮ |
| an | bm | ck | n |

FIG.22

MARK POSITION MEASUREMENT APPARATUS, CHARGED PARTICLE BEAM WRITING APPARATUS, AND MARK POSITION MEASUREMENT METHOD

CROSS-REFERENCE TO RELATED APPLICATION

This application is based upon and claims the benefit of priority from prior Japanese Patent Application No. 2023-071315 filed on Apr. 25, 2023 in Japan, the entire contents of which are incorporated herein by reference.

BACKGROUND OF THE INVENTION

Field of the Invention

An embodiment of the present invention relates to a mark position measurement apparatus, a charged particle beam writing apparatus, and a mark position measurement method, and, for example, to a method for measuring a position of an alignment mark on a writing target object.

Description of Related Art

The lithography technique which advances miniaturization of semiconductor devices is extremely important as a unique process whereby patterns are formed in semiconductor manufacturing. In recent years, with high integration of LSI, the line width (critical dimension) required for semiconductor device circuits is becoming increasingly finer year by year. The electron beam writing technique, which intrinsically has excellent resolution, is used for writing or "drawing" on a wafer and the like with electron beams.

For example, as a known example of employing the electron beam writing technique, there is a writing apparatus using multiple beams. Since it is possible for multi-beam (multiple beam) writing to apply multiple beams at a time, the writing throughput can be greatly increased in comparison with single electron beam writing. For example, a writing apparatus employing the multiple beam system forms multiple beams by letting an electron beam emitted from an electron gun pass through a mask having a plurality of holes, performs blanking control for each beam, reduces each unblocked beam by an optical system, and deflects it by a deflector to irradiate a desired position on a target object or "sample".

In electron beam writing including multi-beam writing, when a writing target substrate is disposed on the stage, an alignment mark formed on the substrate is detected with an electron beam. Using a detected alignment mark as a reference, alignment of a writing region is performed. In electron beam writing, there is a case where a writing position on a mask is highly accurately specified so as to execute writing. For example, when a phase shift mask is formed by multiple layers, it is necessary to align the relative position between the first and second layers. Since the relative position between patterns in respective layers affects the performance of lithography writing using the mask, the relative position should be formed with a high precision of about several nanometers. Further, in an EUV mask, the substrate for which a defect inspection has been performed in advance is used, and patterns are written circumventing coordinates of defects. Then, the mark formed on the mask substrate is measured to be used as a reference for alignment in writing so as to highly accurately specify writing positions.

The line width of current alignment marks has become finer than that of conventional ones. Therefore, when marks are irradiated with electron beams, the electron yield is low, thereby being difficult to acquire contrast. Consequently, there is a problem that since an S/N ratio is low, an alignment mark on the substrate is difficult to find. As a countermeasure for this problem, it is examined to increase the dose of an electron beam in order to acquire contrast. However, according to this method, because a high dose electron beam is applied to a resist in a wide area, the resist is dispersed (scattered) to contaminate the inside of the writing chamber.

Regarding some methods for finding an alignment mark, a method is used which scans a laser beam over a mark, and detects a reflected light to calculate a mark position based on a change of the reflected light from the mark. However, according to this method, there is a case where a plurality of mark candidate signals are measured in the vicinity of the mark due to an influence of a configuration except for the mark, a resist unevenness, a noise, or the like, resulting in a problem that it is difficult to determine which one in the plurality of mark candidate signals is the one of the true mark.

BRIEF SUMMARY OF THE INVENTION

According to one aspect of the present invention, a mark position measurement apparatus includes

- a stage configured to be movable and place thereon a target object on which a plurality of marks have been formed,
- a sensor configured to include an irradiator which irradiates the target object with a laser beam, and a photoreceiver which receives a reflected light from the target object irradiated with the laser beam and outputs a height position distribution of a surface of the target object,
- a position calculation circuit configured to calculate, for each mark of the plurality of marks, a position of a mark candidate signal acquired in a scanned region, by using the height position distribution of the surface of the target object which is for the each mark and obtained by scanning the laser beam over the plurality of marks in a manner intersected with a mark of the plurality of marks,
- a combination generation circuit configured to generate a plurality of combinations by combining mark candidate signals selected one by one from the plurality of marks in a case where a plurality of mark candidate signals are acquired in a scanning direction with respect to at least one of the plurality of marks, and
- a selection circuit configured to select a combination of mark candidate signals, which are mark signals of the plurality of marks, from the plurality of combinations, by comparing, with a predetermined reference value, relative position information regarding mark candidate signals in a same combination in the plurality of combinations.

According to another aspect of the present invention, a charged particle beam writing apparatus includes

- the mark position measurement apparatus described above, and
- a writing mechanism configured to write a pattern, using a charged particle beam, on the target object placed on the stage.

According to yet another aspect of the present invention, a mark position measurement method includes irradiating, using a sensor including an irradiator and a photoreceiver, while moving a target object, with a plurality of marks formed thereon, placed on a stage, the target object with a laser beam by the irradiator, receiving by the photoreceiver a reflected light from the target object irradiated with the laser beam, and outputting a height position distribution of a surface of the target object, calculating, for each mark of the plurality of marks, a position of a mark candidate signal acquired in a scanned region, by using the height position distribution of the surface of the target object, which is for the each mark and obtained by the sensor by scanning the laser beam over the plurality of marks in a manner intersected with a mark of plurality of marks, generating a plurality of combinations by combining mark candidate signals selected one by one from the plurality of marks in a case where a plurality of mark candidate signals are acquired in a scanning direction with respect to at least one of the plurality of marks, and selecting a combination of mark candidate signals, which are mark signals of the plurality of marks, from the plurality of combinations, by comparing, with a predetermined reference value, relative position information regarding mark candidate signals in a same combination in the plurality of combinations, and outputting, as a position of a mark signal, a position of each mark candidate signal configuring the combination selected.

BRIEF DESCRIPTION OF THE DRAWINGS

FIG. 22 is an illustration of an example of a table showing a combination priority according to the first embodiment;

DETAILED DESCRIPTION OF THE INVENTION

Embodiments of the present invention provide an apparatus and method that can highly accurately specify a desired mark signal in a plurality of mark candidate signals of a plurality of mark formed on a target object.

Embodiments below describe a configuration using an electron beam as an example of a charged particle beam. The charged particle beam is not limited to the electron beam, and other charged particle beam such as an ion beam may also be used. Embodiments below describe a writing apparatus using multiple beams. However, it is not limited thereto, and is also preferable to employ a writing apparatus using a single beam. For example, embodiments can be applied to a variable shaped beam (VSB) type writing apparatus.

First Embodiment

Figure 1:
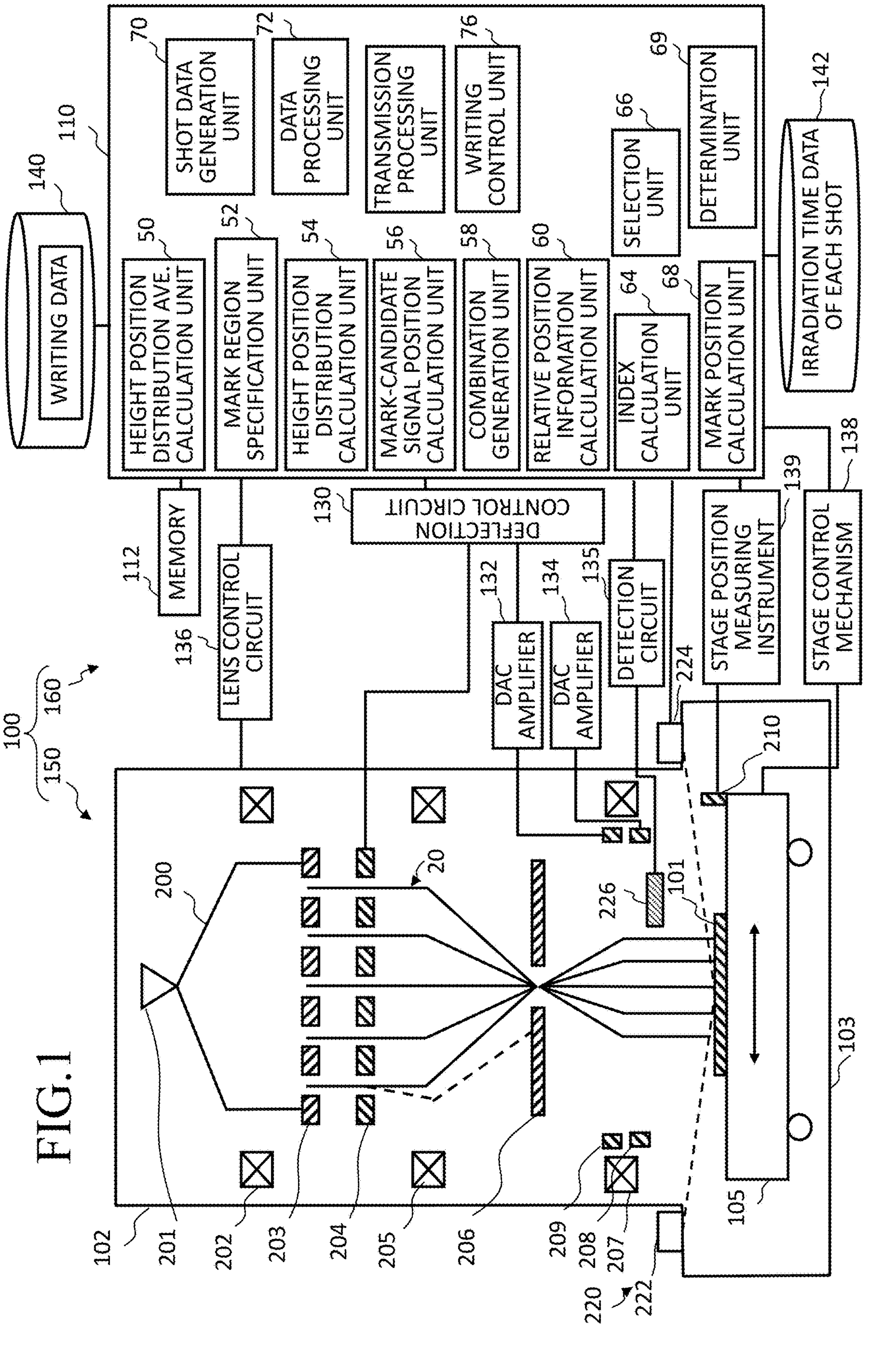
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 and a control system circuit 160. The writing apparatus 100 is an example of a multiple charged particle beam writing apparatus, and a multiple charged particle beam exposure apparatus. The writing mechanism 150 includes an electron optical column 102 (electron beam column) and a writing chamber 103. In the electron optical column 102, there are disposed an electron gun 201, an illumination lens 202, a shaping aperture array substrate 203, a blanking aperture array mechanism 204, a reducing lens 205, a limiting aperture substrate 206, an objective lens 207, deflectors 208 and 209, and a detector 226.

In the writing chamber 103, an XY stage 105 is disposed. On the XY stage 105, there is placed a target object or "sample" 101 such as a mask serving as a writing target substrate when writing (exposure) is performed. The target object 101 is, for example, an exposure mask used when fabricating semiconductor devices, or a semiconductor substrate (silicon wafer) for fabricating semiconductor devices. Further, the target object 101 may be, for example, a mask blank on which a resist has been applied and nothing has yet been written. On target object 101, a plurality of alignment marks (concave-convex marks) whose concave (recessed) surface and convex (projected) surface are made of the same material, to be described later, are formed.

Further, on the XY stage 105, a mirror 210 for measuring the position of the XY stage 105 is arranged.

On the writing chamber 103, a Z sensor 220 (an example of a sensor) is disposed. The Z sensor 220 includes, for example, an irradiator 222 which generates a visible laser beam, and a photoreceiver 224 which receives a reflected light from a target object irradiated with the laser beam. The irradiator 222 generates a laser beam in oblique incidence on the surface of the target object 101 arranged on the XY stage 105 in the writing chamber 103. Thus, the irradiator 222 irradiates the target object 101 with laser beams. The laser beam emitted from the irradiator 222 has a light intensity distribution of normal distribution. Further, the laser beam emitted from the irradiator 222 has a diameter larger than the width of the alignment mark formed on the target object 101. This is due to the beam diameter at the emission, and the optical element for guiding beams, and is largely affected by the phenomenon that the beam extends in an incident direction because of the oblique incidence on the target object. For example, a laser beam with a diameter of 10-300 μm on the surface of the target object 101 is used. For example, it is preferable to use a laser beam with a diameter of about 200 μm on the surface of the target object 101. The photoreceiver 224 receives a reflected light from the target object 101 along with irradiation of the laser beam, and outputs information on the height of the surface of the target object 101. As the photoreceiver 224, an optical position sensor is used, for example. The photoreceiver 224 receives a reflected light, measures the height position of the surface of the target object 101 based on a deviation of the light-receiving position on the surface which received the light, and outputs information on the measured position.

The control system circuit 160 includes a control computer 110, a memory 112, a deflection control circuit 130, digital-analog converter (DAC) amplifier units 132 and 134, a detection circuit 135, a lens control circuit 136, a stage control mechanism 138, a stage position measuring instrument 139, and storage devices 140 and 142 such as magnetic disk drives. The control computer 110, the memory 112, the deflection control circuit 130, the detection circuit 135, the lens control circuit 136, the stage control mechanism 138, the stage position measuring instrument 139, and the storage devices 140 and 142 are connected to each other through a bus (not shown). The DAC amplifier units 132 and 134 and the blanking aperture array mechanism 204 are connected to the deflection control circuit 130. The deflector 209 is composed of at least four electrodes (or "at least four poles"), and controlled by the deflection control circuit 130 through the DAC amplifier unit 132 disposed for each electrode. The deflector 208 is composed of at least four electrodes (or "at least four poles"), and controlled by the deflection control circuit 130 through the DAC amplifier unit 134 disposed for each electrode. Electromagnetic lenses such as the illumination lens 202, the reducing lens 205, and the objective lens 207 are controlled by the lens control circuit 136. The detector 226 is connected to the detection circuit 135.

The position of the XY stage 105 is controlled by the drive of each axis motor (not shown) which is controlled by the stage control mechanism 138. Based on the principle of laser interferometry, the stage position measuring instrument 139 measures the position of the XY stage 105 by receiving a reflected light from the mirror 210.

In the control computer 110, there are arranged a height position distribution average calculation unit 50, a mark region specification unit 52, a height position distribution calculation unit 54, a mark candidate signal position calculation unit 56, a combination generation unit 58, a relative position information calculation unit 60, an index calculation unit 64, a selection unit 66, a mark position calculation unit 68, a determination unit 69, a shot data generation unit 70, a data processing unit 72, a transmission processing unit 74, and a writing control unit 76. Each of the " . . . units" such as the height position distribution average calculation unit 50, the mark region specification unit 52, the height position distribution calculation unit 54, the mark candidate signal position calculation unit 56, the combination generation unit 58, the relative position information calculation unit 60, the index calculation unit 64, the selection unit 66, the mark position calculation unit 68, the determination unit 69, the shot data generation unit 70, the data processing unit 72, the transmission processing unit 74, and the writing control unit 76 includes processing circuitry. The processing circuitry includes, for example, an electric circuit, computer, processor, circuit board, quantum circuit, semiconductor device, or the like. Each " . . . unit" may use common processing circuitry (the same processing circuitry), or different processing circuitry (separate processing circuitry). Information input/output to/from the height position distribution average calculation unit 50, the mark region specification unit 52, the height position distribution calculation unit 54, the mark candidate signal position calculation unit 56, the combination generation unit 58, the relative position information calculation unit 60, the index calculation unit 64, the selection unit 66, the mark position calculation unit 68, the determination unit 69, the shot data generation unit 70, the data processing unit 72, the transmission processing unit 74, and the writing control unit 76, and information being operated are stored in the memory 112 each time.

The XY stage 105, the Z sensor 220, the deflector 209, the detector 226, the detection circuit 135, the height position distribution average calculation unit 50, the mark region specification unit 52, the height position distribution calculation unit 54, the mark candidate signal position calculation unit 56, the combination generation unit 58, the relative position information calculation unit 60, the index calculation unit 64, the selection unit 66, the mark position calculation unit 68, the determination unit 69, and the like are used not only as configuration elements of the writing apparatus 100 but also as those of the mark position measurement apparatus according to the first embodiment.

Writing operations of the writing apparatus 100 are controlled by the writing control unit 76. Processing of transmitting irradiation time data of each shot to the deflection control circuit 130 is controlled by the transmission control unit 74.

Writing data (chip data) is input from the outside of the writing apparatus 100, and stored in the storage device 140.

Chip data defines information on a plurality of FIG. patterns configuring a chip pattern. Specifically, for example, a figure code, coordinates, a size, and the like are defined for each figure pattern.

FIG. 1 shows a configuration necessary for describing the first embodiment. Other configuration elements generally necessary for the writing apparatus 100 may also be included therein.

Figure 2:
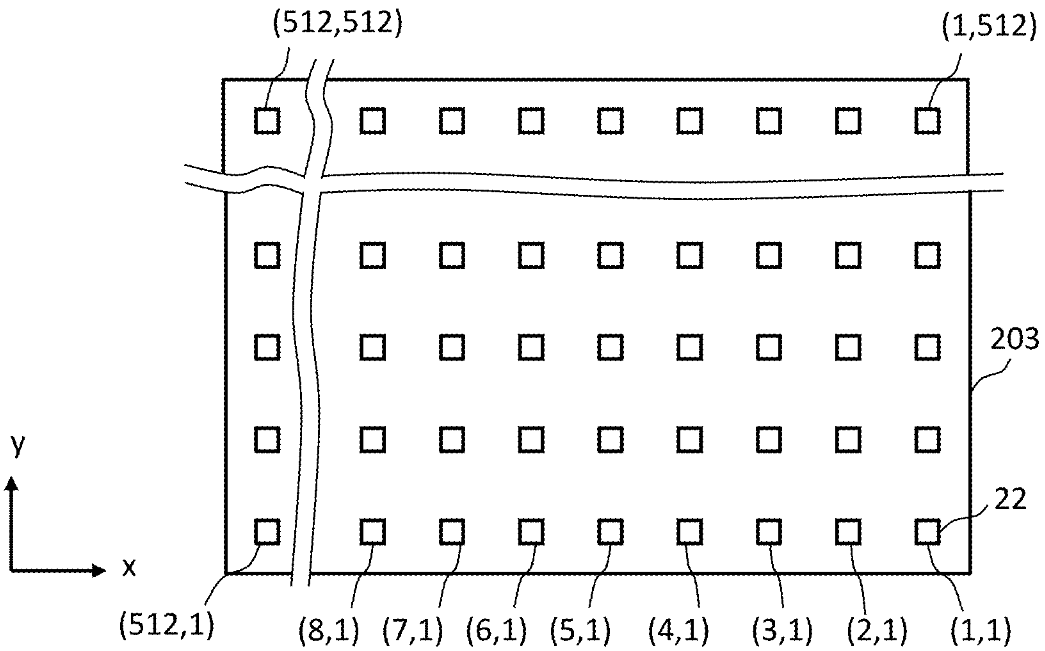
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the shaping aperture array substrate 203. In the case of FIG. 2, for example, holes (openings) 22 of 512×512, that is 512 (holes arrayed in the y direction)×512 (holes arrayed in the x direction), are formed. The number of holes 22 is not limited thereto. For example, it is also preferable to form the holes 22 of 32×32. Each of the holes 22 is a rectangle having the same dimension and shape as each other. Alternatively, each of the holes 22 may be a circle with the same diameter as each other. Multiple beams 20 are formed by letting portions of an electron beam 200 individually pass through a corresponding one of a plurality of holes 22. In other words, the shaping aperture array substrate 203 forms and emits the multiple beams 20. The shaping aperture array substrate 203 is an example of an emission source of the multiple beams 20.

Figure 3:
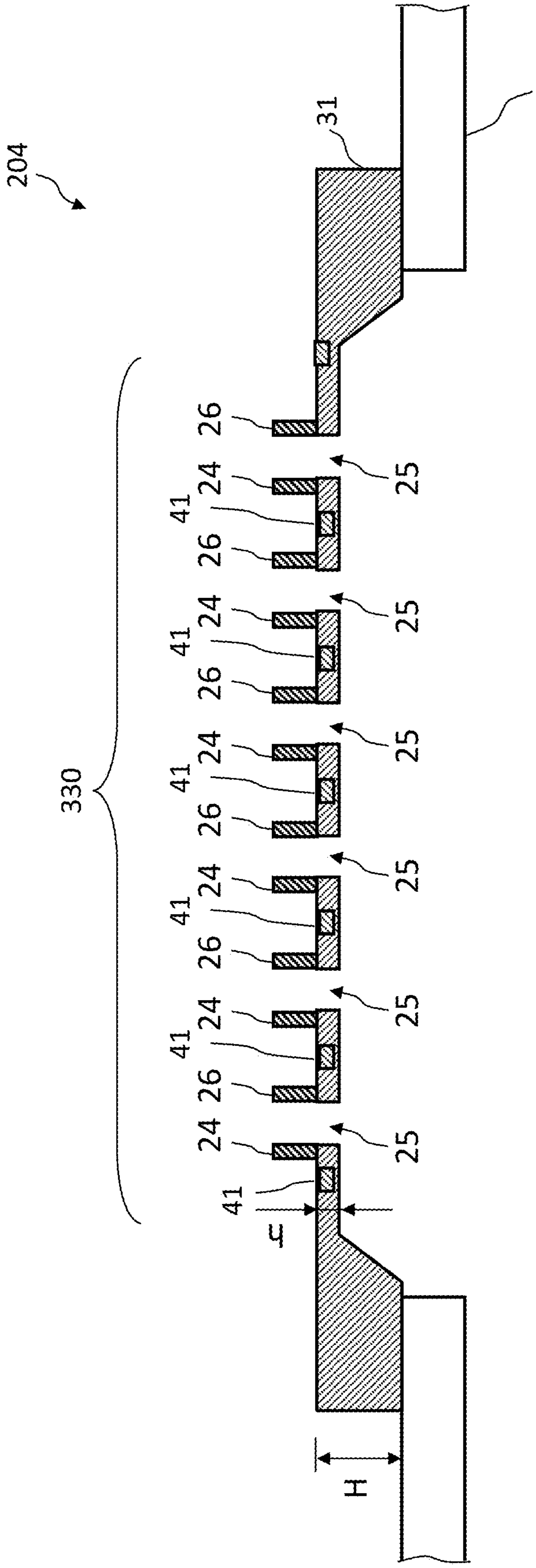
FIG. 3 is a sectional view showing a configuration of a blanking aperture array mechanism according to the first embodiment.

FIG. 3 is a sectional view showing a configuration of a blanking aperture array mechanism according to the first embodiment. In the blanking aperture array mechanism 204, as shown in FIG. 3, a blanking aperture array substrate 31 using a semiconductor substrate made of silicon, etc. is disposed on a support table 33. In a membrane region 330 at the center of the blanking aperture array substrate 31, a plurality of passage holes 25 (openings), through each of which a corresponding one of the multiple beams 20 passes, are formed at positions each corresponding to each hole 22 in the shaping aperture array substrate 203 shown in FIG. 2. A pair of a control electrode 24 and a counter electrode 26, (blanker: blanking deflector), is arranged in a manner such that the electrodes 24 and 26 are opposite to each other across a corresponding one of the plurality of the passage holes 25. A control circuit 41 (logic circuit) which applies a deflection voltage to the control electrode 24 for the passage hole 25 concerned is disposed inside the blanking aperture array substrate 31 and close to each corresponding passage hole 25. The counter electrode 26 for each beam is grounded.

In the control circuit 41, an amplifier (not shown) (an example of a switching circuit) is arranged. As an example of the amplifier, a CMOS (Complementary MOS) inverter circuit serving as a switching circuit is disposed. In regard to inputs (IN) to the CMOS inverter circuit, either an L (low) potential (e.g., ground potential) lower than a threshold voltage, or an H (high) potential (e.g., 1.5 V) higher than or equal to the threshold voltage is applied as a control signal. According to the first embodiment, in a state where an L potential is applied to the input (IN) of the CMOS inverter circuit, the output (OUT) of the CMOS inverter circuit, which is to be applied to the control circuit 41, becomes a positive potential (Vdd), and then, a corresponding beam is deflected by an electric field due to a potential difference from the ground potential of the counter electrode 26, and is controlled to be in a beam OFF condition by being blocked by the limiting aperture substrate 206. In contrast, in a state (active state) where an H potential is applied to the input (IN) of the CMOS inverter circuit, the output (OUT) of the CMOS inverter circuit becomes a ground potential, and therefore, since there is no potential difference from the ground potential of the counter electrode 26, a corresponding beam is not deflected, and is controlled to be in a beam ON condition by passing through the limiting aperture substrate 206. Blanking control is provided by such deflection.

Next, operations of the writing mechanism 150 will be described. The electron beam 200 emitted from the electron gun 201 (emission source) almost perpendicularly (e.g., vertically) illuminates the whole of the shaping aperture array substrate 203 by the illumination lens 202. A plurality of rectangular holes 22 (openings) are formed in the shaping aperture array substrate 203. The region including all of the plurality of holes 22 is irradiated with the electron beam 200. For example, rectangular multiple beams (a plurality of electron beams) 20 are formed by letting portions of the electron beam 200 applied to the positions of the plurality of holes 22 individually pass through a corresponding one of the plurality of holes 22 in the shaping aperture array substrate 203. The multiple beams 20 individually pass through corresponding blankers of the blanking aperture array mechanism 204. The blanker provides blanking control such that a corresponding beam individually passing becomes in an ON condition during a set writing time (irradiation time).

The multiple beams 20 having passed through the blanking aperture array mechanism 204 are reduced by the reducing lens 205, and travel toward the hole in the center of the limiting aperture substrate 206. Then, the electron beam which was deflected by the blanker of the blanking aperture array mechanism 204 deviates (shifts) from the hole in the center of the limiting aperture substrate 206 and is blocked by the limiting aperture substrate 206. In contrast, the electron beam which was not deflected by the blanker of the blanking aperture array mechanism 204 passes through the hole in the center of the limiting aperture substrate 206 as shown in FIG. 1. Thus, the limiting aperture substrate 206 blocks each beam which was deflected to be in the OFF state by the blanker of the blanking aperture array mechanism 204. Then, one shot of each beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, all of the multiple beams 20 having passed through the limiting aperture substrate 206 are collectively deflected in the same direction by the deflectors 208 and 209 in order to irradiate respective beam irradiation positions on the target object 101. When, for example, the XY stage 105 is continuously moving, tracking control is performed by the deflector 208 so that the beam irradiation position may follow the movement of the XY stage 105. Ideally, the multiple beams 20 irradiating at a time are aligned at the pitch obtained by multiplying the arrangement pitch of a plurality of holes 22 in the shaping aperture array substrate 203 by the desired reduction ratio described above.

In addition to multiple beam writing, for example, in electron beam writing including single beam writing using the VSB method, an alignment mark formed on a target object is detected when the writing target substrate is disposed on the stage. Then, using a detected alignment mark as a reference, alignment of the writing region is carried out.

Current alignment marks are formed with a micro line width compared with that of conventional alignment marks.

Figure 4:
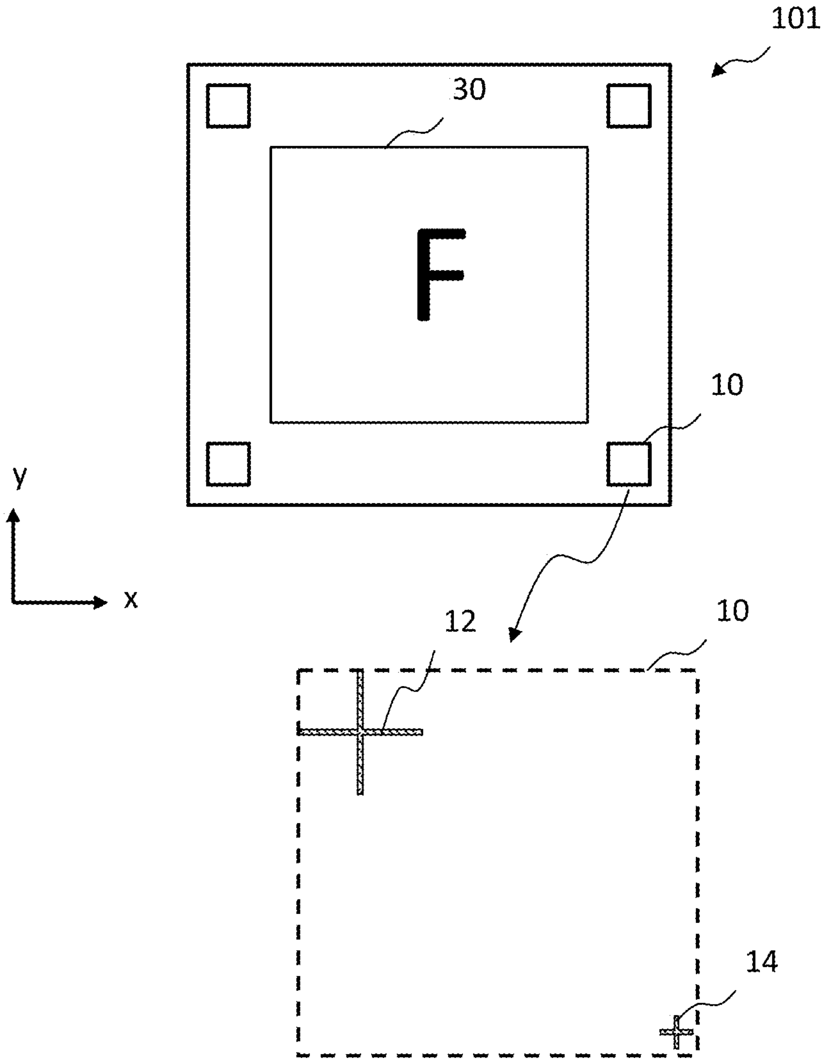
FIG. 4 is a top view showing an example of a configuration of a target object according to the first embodiment.

FIG. 4 is a top view showing an example of a configuration of a target object according to the first embodiment. In FIG. 4, on the target object 101, there are set a writing region 30 at the center for writing a desired pattern, and alignment mark regions 10 outside the writing region 30 and, for example, at the four corners of the target object 101 respectively. In the example of FIG. 4, four alignment mark regions 10 are set. In each alignment mark region 10, there formed a large mark 12 (an example of an alignment mark and a concave-convex mark) and a small mark 14 (another example of an alignment mark and a concave-convex mark).

FIG. 4 shows the case where the large mark 12 and the small mark 14 are formed at diagonal positions in the alignment mark region 10 of, for example, 11000 μm square. Cross patterns are used as the large mark 12 and the small mark 14, for example. The large mark 12 and the small mark 14 are formed as concave-convex marks of a concave-convex configuration, whose concave (recessed) surface and convex (projected) surface are made of the same material. A cross pattern serves as a concave (recessed) portion, and the outside portion of the cross pattern serves as a convex (projected) portion. Thereby, concave-convex marks are formed on the target object 101.

The size of the large mark 12 is formed to be large, such as about 4000 μm, and mainly used, as a temporary alignment mark, for searching for the alignment mark region 10 in the wide range region on the surface of the target object 101, for example. The size of the small mark 14 is formed to be small, such as about 400 μm, and used as an alignment mark serving as a position reference. The large mark 12 may be used as an alignment mark serving as a position reference. The small mark 14 may be used as a mark for searching for the alignment mark region 10 in the wide range region on the surface of the target object 101.

For the large mark 12 and the small mark 14, patterns of the same line width are used, for example. Each of the large mark 12 and the small mark 14 is formed by a cross pattern acquired by crossing a line pattern having a line width of 2-200 μm and in the x direction, and a line pattern having a line width of 2-200 μm and in the y direction. The line width of the concave (recessed) portion of each of the large mark 12 and the small mark 14 is formed to be 4-5 μm. Detailed configurations are described below.

Figure 5:
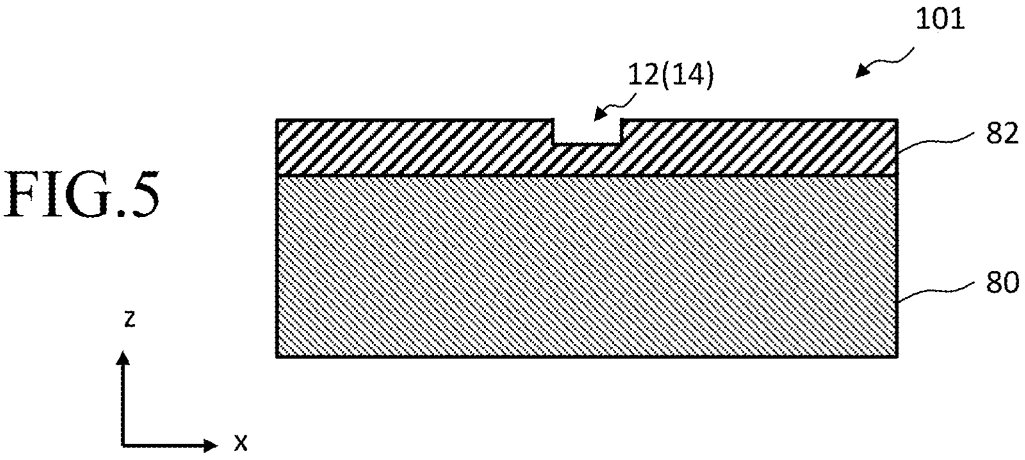
FIG. 5 is a sectional view showing an example of a configuration of an alignment mark according to the first embodiment.

FIG. 5 is a sectional view showing an example of a configuration of an alignment mark according to the first embodiment. FIG. 5 shows the case where an exposure mask is used as the target object 101. As shown in FIG. 5, for example, on a glass substrate 80 of the target object 101, a light shielding film 82 made of chromium (Cr), etc. is formed. Then, a recess is formed in the light shielding film 82. This recessed concave portion is used as the line width of the alignment mark. Therefore, the surface of the concave portion and that of the convex portion exist in the same light shielding film 82. Thus, the small mark 14 used as an alignment mark is formed in the concave-convex configuration of the same material. Also, the large mark 12 is similarly formed in the concave-convex configuration of the same material. Then, a resist is applied to the target object 101 (mask) on which these marks are formed. The target object 101 is transferred into the writing apparatus 100 to perform mark measurement.

Figure 6:
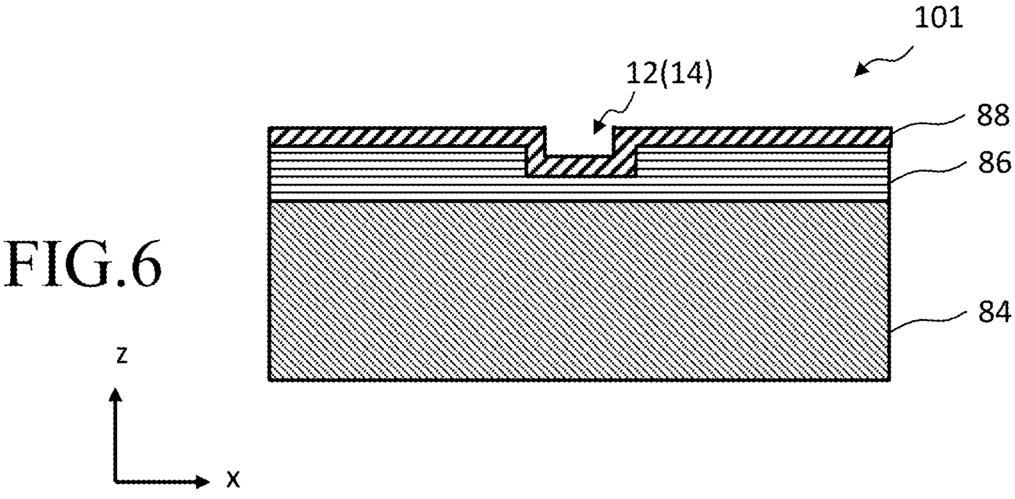
FIG. 6 is a sectional view showing another example of a configuration of an alignment mark according to the first embodiment.

FIG. 6 is a sectional view showing another example of a configuration of an alignment mark according to the first embodiment. FIG. 6 shows the case where an EUV exposure mask is used as the target object 101. On a low thermal expansion glass substrate 84 of the target object 101, a multilayer film 86 where, for example, molybdenum (Mo) and silicon (Si) are laminated into multiple layers is formed. Then, a recess is formed in a portion of the multilayer film 86. On the multilayer film 86 including the recess, an absorber film 88 (antireflection film) mainly made of, for example, Cr and tantalum (Ta) is formed. The recessed concave portion of the absorber film 88 formed on the recess portion of the multilayer film 86 is used as the line width of the alignment mark. Therefore, the surface of the concave portion and that of the convex portion exist in the same absorber film 88. Thus, the small mark 14 used as an alignment mark is formed in the concave-convex configuration of the same material. Also, the large mark 12 is similarly formed in the concave-convex configuration of the same material. Then, a resist is applied to the target object 101 (mask) on which these marks are formed. The target object 101 is transferred into the writing apparatus 100 to perform mark measurement.

FIGS. 5 and 6 describe the case where the mark portion is a recessed concave, and therefore, processing described below is a concave signal processing. However, the mark portion may be a projected convex. In that case, the processing is the same as the above, except that an output signal is a convex signal.

Conventionally, an alignment mark on the surface of the target object 101 is detected (searched for) using electron beams, and the position of the alignment mark is measured with the electron beams. However, with respect to a mark of the concave-convex configuration of the same material, if scanning an electron beam over the mark, since difference in electron yields is small, contrast is difficult to obtain. As a result, there is a problem that since the S/N ratio is small, the alignment mark on the target object 101 cannot be found easily. To cope with this problem, it is examined to increase the dose (irradiation amount) of an electron beam in order to acquire contrast. However, this method has a problem that because a high dose electron beam is applied to a resist in a wide area, the resist is dispersed (scattered) to contaminate the inside of the writing chamber. Then, according to the first embodiment, using a laser beam by which no resist or a negligible level of resist may be dispersed, an alignment mark is searched for in a wide range region on the surface of the target object 101, and the center position of the alignment mark is measured. After specifying the center position of an alignment mark, the center position is measured by an electron beam to obtain a more accurate measurement value than that in the case of using a laser beam.

Figure 7:
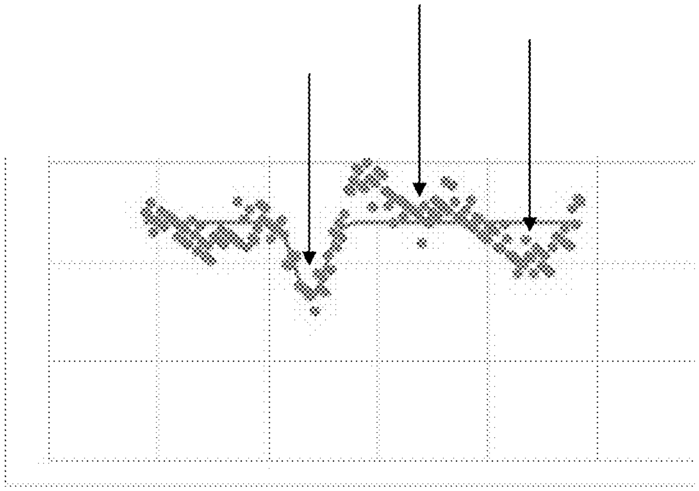
FIG. 7 is an illustration showing an example of a height position distribution close to a mark according to the first embodiment.

FIG. 7 is an illustration showing an example of a height position distribution close to a mark according to the first embodiment.

Figure 8:
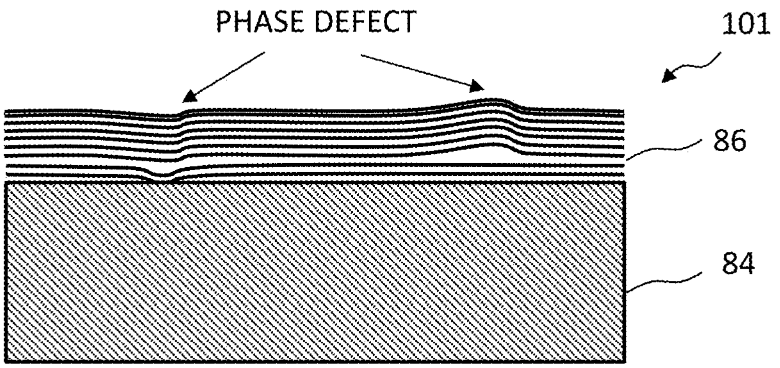
FIG. 8 is an illustration showing an example of a concave-convex configuration other than a concave-convex mark according to the first embodiment.

FIG. 8 is an illustration showing an example of a concave-convex configuration other than a concave-convex mark according to the first embodiment.

Figure 9:
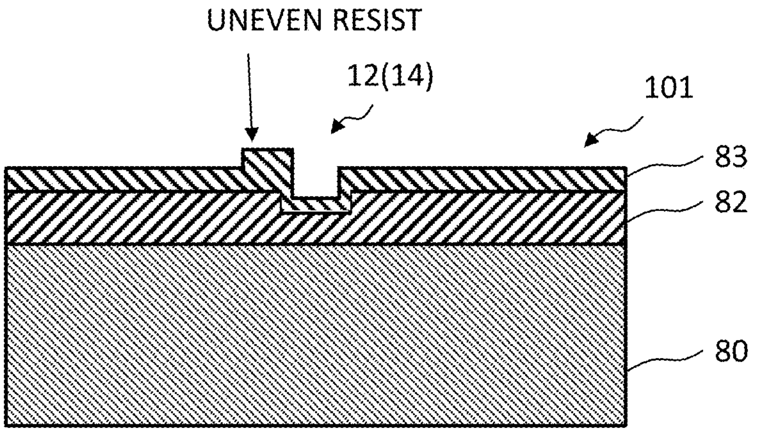
FIG. 9 is an illustration showing another example of a concave-convex configuration other than a concave-convex mark according to the first embodiment.

FIG. 9 is an illustration showing another example of a concave-convex configuration other than a concave-convex mark according to the first embodiment.

In FIG. 7, the ordinate axis represents a height position, and the abscissa axis represents a position on the surface. The small mark 14 (or large mark 12) serving as an alignment mark has its center at the concave portion of the concave-convex configuration. Therefore, the position of the small mark 14 (or large mark 12) exists at the position of the concave portion in the height position distribution. However, in the example of FIG. 7, a plurality of concave-convex signals which show concave portions are detected (arrow portion). This is due to the influence of a concave-convex configuration except for a concave-convex mark, or of a noise. As a concave-convex configuration other than a concave-convex mark, for example, as shown in FIG. 8, there is a case of a phase defect of the multilayer film 86 of the EUV exposure mask. In that case, a concave-convex surface is formed on the surface of the phase defect. In addition, for example, as shown in FIG. 9, there is a case where an uneven application occurs in a resist film 83 applied to the surface of the target object 101. Therefore, a problem occurs that it is difficult to determine which signal is the one of the small mark 14 (or large mark 12) (concave-convex mark) in a plurality of concave-convex signals in the height position distribution.

When a mark portion is convex, an output signal is a convex signal. In that case, a plurality of concave-convex signals showing a convex portion are detected. Therefore, according to the first embodiment, when a mark portion is concave, concave-convex signals are measurement signals indicating a concave portion. When a mark portion is convex, concave-convex signals are measurement signals indicating a convex portion.

According to the first embodiment, when a plurality of concavo-convex signals indicating a concave portion in each aliment mark are measured by scanning over the plurality of alignment marks (concave-convex marks), a true alignment mark is specified by using a relation with a concavo-convex signal indicating a concave portion of the other alignment mark. Detailed operations are described below.

Figure 10:
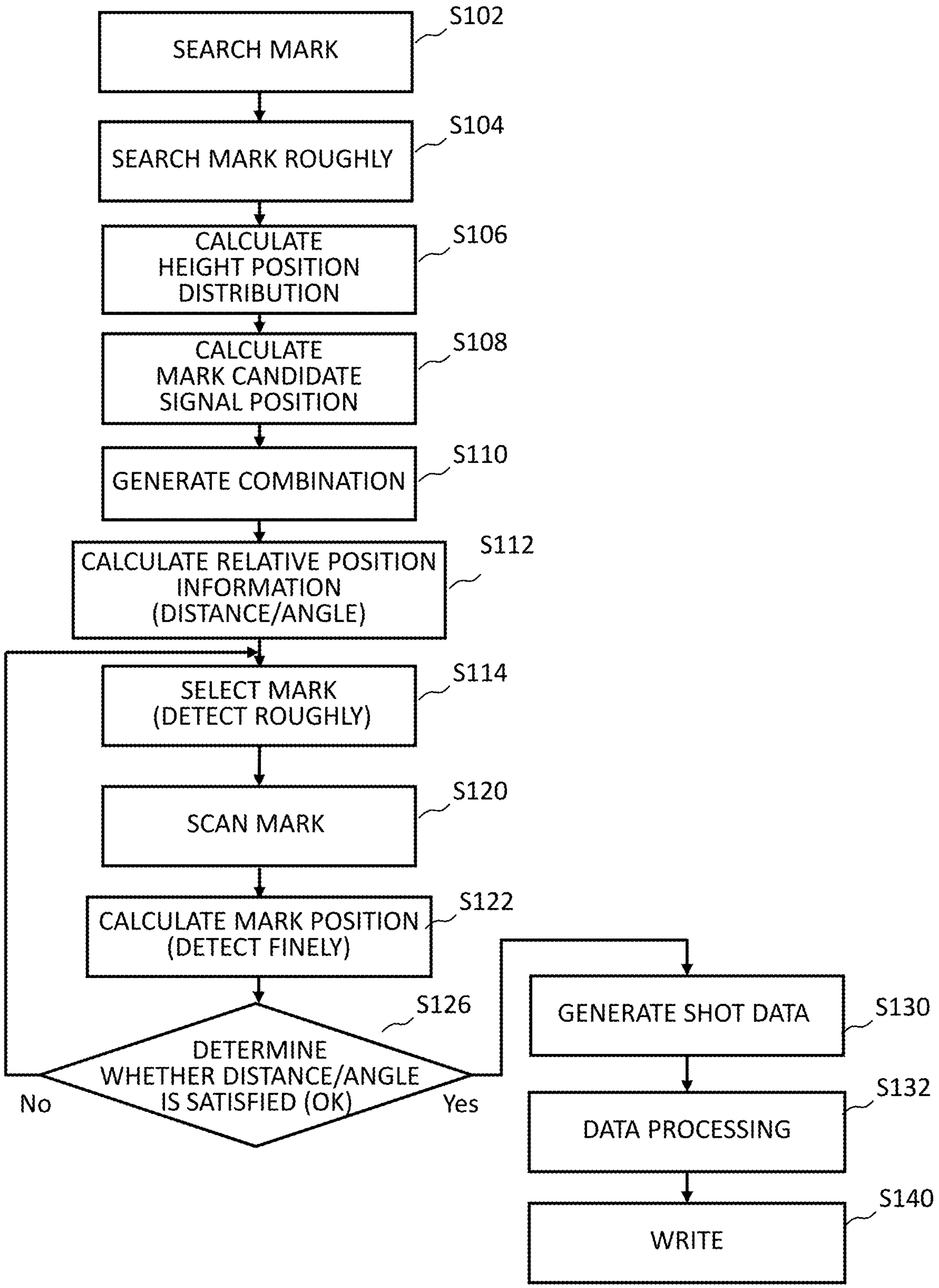
FIG. 10 is a flowchart showing an example of main steps of a writing method according to the first embodiment.

FIG. 10 is a flowchart showing an example of main steps of a writing method according to the first embodiment. In FIG. 10, the writing method of the first embodiment executes a series of steps: a mark search step (S102), a mark rough search step (S104), a height position distribution calculation step (S106), a mark candidate signal position calculation step (S108), a combination generation step (S110), a relative position information (distance/angle) calculation step (S112), a mark selection (rough detection) step (S114), a mark scan step (S120), a mark position calculation (fine detection) step (S122), a determination step (S126), a shot data generation step (S130), a data processing step (S132), and a writing step (S140). Depending on a mask position accuracy required for writing, it may proceed to the shot data generation step (S130) from the mark selection (rough detection) step (S114).

In the mark search step (S102), using the Z sensor 220, the large mark 12 is searched for in the wide range region on the target object 101. The position of the alignment mark region 10 on the target object 101 has been set in the design. However, the relative positional relationship between the XY stage 105 and the target object 101 having been transferred into the writing chamber 103 and placed on the XY stage 105 is not necessarily in accordance with the design positional relationship perfectly. For example, arrangement deviation of the target object 101 may occur. Accordingly, there may possibly be a case in which the large mark 12 does not exist at the position where the large mark 12 should exist in the design. Then, an actual large mark 12 is searched for based on the design position of the large mark 12. Specifically, the XY stage 105 is moved to a design position where the large mark 12 should be irradiated with a laser beam from the Z sensor 220. Regarding this position as a reference, the XY stage 105 is moved, for example, in the −x direction by a predetermined pitch from a position where an irradiation position of a laser beam is sufficiently far, for example, in the −x direction from the reference position. By this method, the height position of the target object 101 is measured at a plurality of measurement positions. Thereby, the height position can be measured at a plurality of measurement positions which are relatively in the x direction on the surface of the target object. Information on measured height positions is output to the control computer 110. Further, instead of moving the XY stage 105 to the design position where the large mark 12 should be irradiated with a laser beam, it is also preferable to move the irradiator 222 and the photoreceiver 224 in conjunction with each other in order to apply a laser beam to the surface of the target object 101. Alternatively, while changing the direction of radiation of a laser beam from the irradiator 222, and making the light receiving position of the photoreceiver 224 be in conjunction with the change, a laser beam may be applied to the surface of the target object 101.

The height position distribution calculation unit 54 inputs measured height position information, and calculates a height position distribution. The mark region specification unit 52 searches for a position whose height position is lower than that of the surrounding outer position, and specifies the position as the alignment mark region 10. Details on a height position distribution acquired from the Z sensor 220 will be described later.

In the mark rough search step (S104), while moving the target object 101 placed on the XY stage 105, a height position distribution of the surface of the target object 101 is measured which is obtained by scanning a laser beam, using the Z sensor 220, such that the laser beam intersects the small mark 14 (or large mark 12) (concave-convex mark) in the specified alignment mark region 10. If the alignment mark region 10 is located at each of four corners of the target object 101, the mark rough search step (S104) for the small mark 14 (or large mark 12) (concave-convex mark) is performed in each of the specified alignment mark regions 10 at the four corners.

Figure 11:
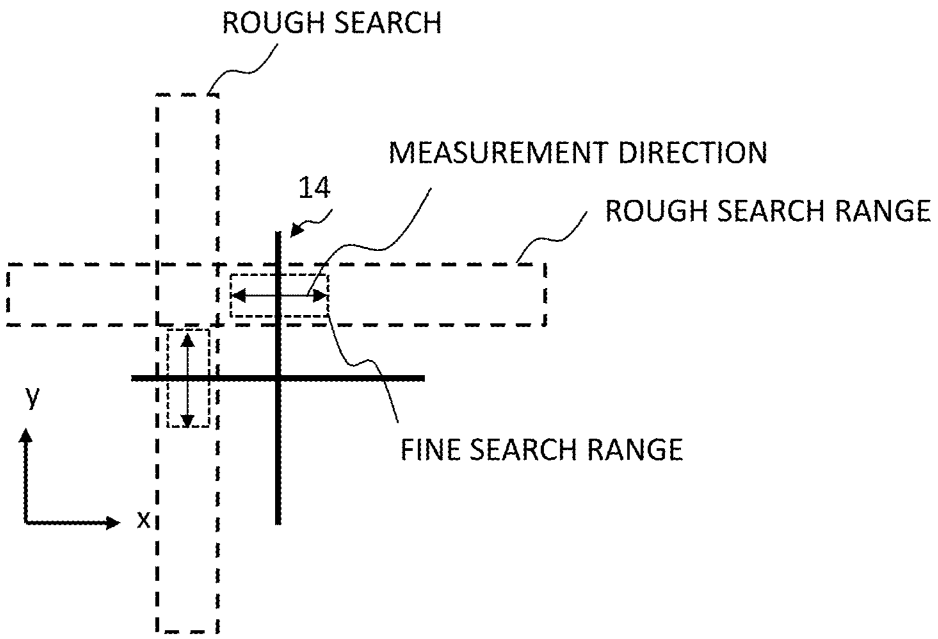
FIG. 11 is an illustration explaining a method of mark rough search according to the first embodiment.

FIG. 11 is an illustration explaining a method of mark rough search according to the first embodiment. As shown in FIG. 11, the small mark 14 has been formed by cruciformly intersecting the line pattern in the x direction and the line pattern in the y direction. Then, the position of the line pattern of the small mark 14 is measured as shown in FIG. 11. Defining the measurement direction to be perpendicular to the direction of the line pattern, scanning is performed in the measurement direction. For example, the distance twice the beam diameter of the laser beam is scanned. FIG. 11 shows the case where the line pattern in the y direction is scanned in the x direction, and the line pattern in the x direction is scanned in the y direction. Specifically, by moving the XY stage 105, the irradiation position, on the surface of the target object 101, of the laser beam from the Z sensor 220 is serially moved to a plurality of measurement positions. If there are many noise signals dependent on a location, etc., noise components can be averaged or cancelled out by repeatedly averaging the noise components at a plurality of locations which are in a non-measurement direction perpendicular to the measurement direction. For example, when measuring the line pattern in the y direction described above, after scanning and measuring in the x direction, it moves stepwise in the y direction in order to scan and measure in the x direction, which is performed repeatedly. In the mark rough search step (S104), when scanning in the x and y directions, as shown in FIG. 11, it is preferable to perform scanning in a range larger than the size of the target mark (here, for example, the small mark 14).

Figure 12:
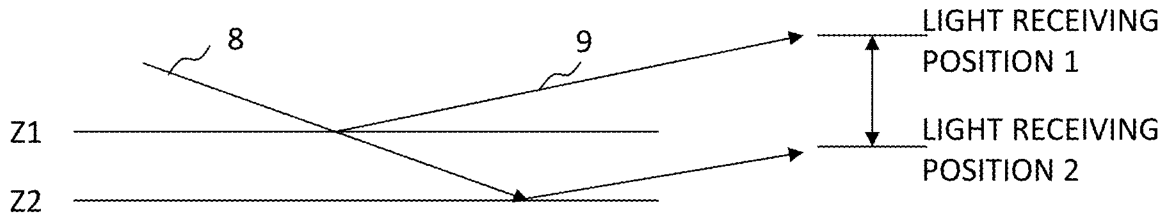
FIG. 12 is an illustration explaining a measurement principle of a Z sensor according to the first embodiment.

FIG. 12 is an illustration explaining a measurement principle of a Z sensor according to the first embodiment. In FIG. 12, the light receiving position 1 is the center of gravity position of a reflected light 9 which is a reflected light of a laser beam 8 reflected at the height Z1 and is received by a photoreceiver. The light receiving position 2 is the center of gravity position of a reflected light 9 which is a reflected light of a laser beam 8 reflected at the height Z2 and is received by a photoreceiver. Thus, the light receiving position has changed. The height position on the surface of the target object 101 can be calculated by multiplying the light receiving position by a height conversion coefficient.

Figure 13:
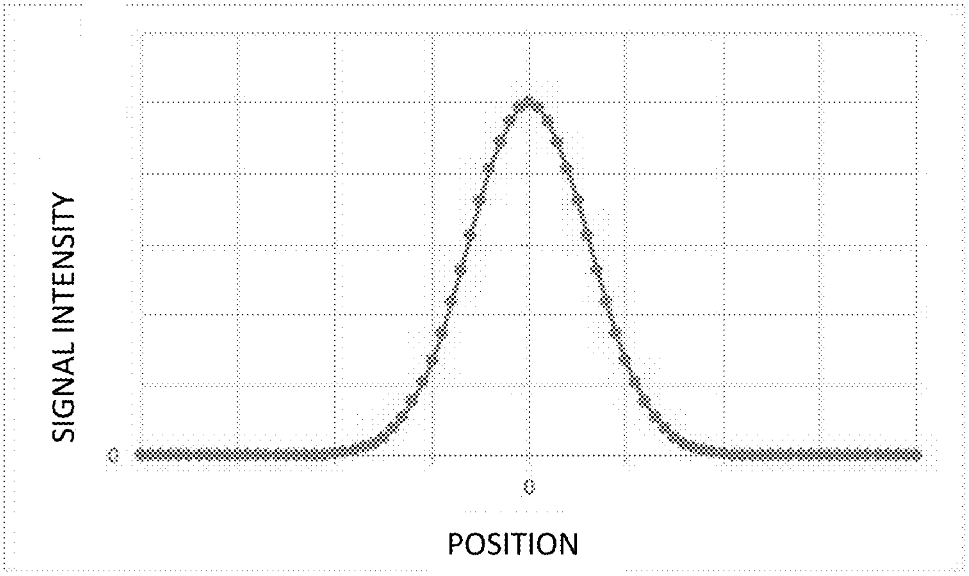
FIG. 13 is an illustration showing an example of an intensity distribution of a laser beam used by a Z sensor according to the first embodiment.

FIG. 13 is an illustration showing an example of an intensity distribution of a laser beam used by a Z sensor according to the first embodiment. As shown in FIG. 13, the laser beam used by the Z sensor 220 of the first embodiment has a light intensity distribution of normal distribution. That is, the intensity of the laser beam becomes large as it goes close to the center of the beam, and the intensity becomes small as it radially goes outward. Preferably, for example, a visible light is used as the laser beam.

Figure 14:
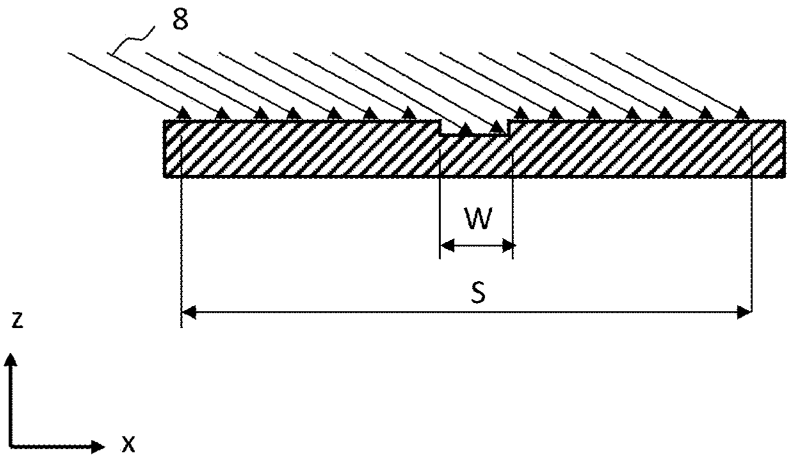
FIG. 14 is a sectional view showing an example of the state of an irradiation light in the case of scanning an alignment mark by a Z sensor according to the first embodiment.

FIG. 14 is a sectional view showing an example of the state of an irradiation light in the case of scanning an alignment mark by a Z sensor according to the first embodiment.

Figure 15:
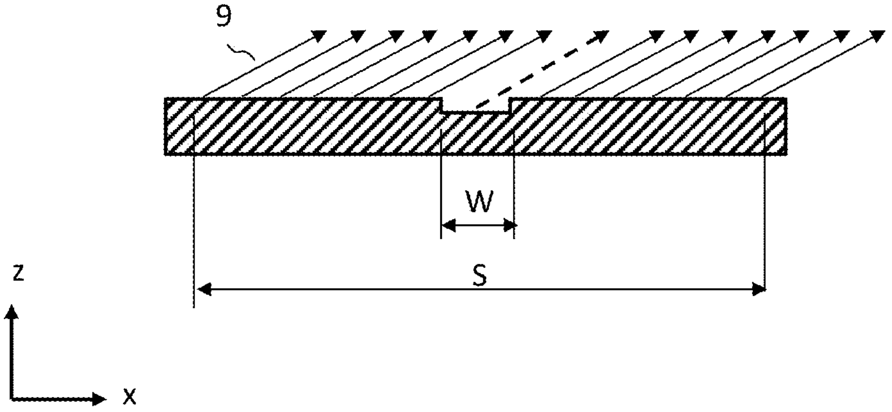
FIG. 15 is a sectional view showing an example of the state of a reflected light in the case of scanning an alignment mark by a Z sensor according to the first embodiment.

FIG. 15 is a sectional view showing an example of the state of a reflected light in the case of scanning an alignment mark by a Z sensor according to the first embodiment. With miniaturization of the line width of the large mark 12 and the small mark 14, the size larger than the width size (line width size) of the large mark 12 (concave-convex mark) and the small mark 14 (concave-convex mark) is used as the diameter size of the laser beam 8 used by the Z sensor 220. The surface of the target object 101 is irradiated with a laser beam having a diameter of, for example, 10-300 μm. The surface of the target object 101 is irradiated with a laser beam having a diameter of, for example, 200 μm. The irradiator 222 of the Z sensor 220 applies the laser beam 8 in oblique incidence on the surface of the target object 101. Therefore, as shown in FIG. 14, the wide region having the width S and including the small mark 14 (or large mark 12) having the line width W is irradiated with the laser beam 8 at a time. Then, the photoreceiver 224 receives the reflected light 9 from the target object 101 along with the irradiation of the laser beam 8. At this time, simultaneously, as shown in FIG. 15, the photoreceiver 224 receives the reflected light 9 from the wide region having the width S and including the small mark 14 (or large mark 12) having the line width W. As shown in FIG. 15, the reflected light 9 partially includes a light (dotted line) with information on the height of the bottom surface of the concave portion of the small mark 14 (or large mark 12) (concave-convex mark). Then, the photoreceiver 224 outputs information on the height of the surface of the target object 101.

In the height position distribution calculation step (S106), the height position distribution calculation unit 54 inputs information on the measured height position, and calculates a height position distribution. As shown in FIG. 11, the height position distribution of the surface of the target object 101 can be obtained by performing scanning such that the laser beam 8 intersects the small mark 14 (or large mark 12) (concave-convex mark). Positions of the line pattern are measured at the upper, lower, right, and left positions of the small mark 14 (or large mark 12) in terms of the directional relationship shown in FIG. 11 in the mark rough search step (S104). In this process, since the measurement is repeated multi-stepwise while shifting the position in the extending direction (non-measurement direction) of the line pattern, information on multi-stage height positions is output from the photoreceiver 224. Then, the height position distribution average calculation unit 50 averages the measuring results, measured at multiple stages, in the non-measurement direction. Thereby, the influence of a difference between mark positions and that of a noise at the measurement time can be reduced.

If the small mark 14 (or large mark 12) exists at each of the four corners of the target object 101, the height position distribution calculation step (S106) is performed for each small mark 14 (or large mark 12) (concave-convex mark).

In the examples described above, the height position of the surface of the target object 101 is measured by the Z sensor. However, it is not limited thereto.

Figure 16:
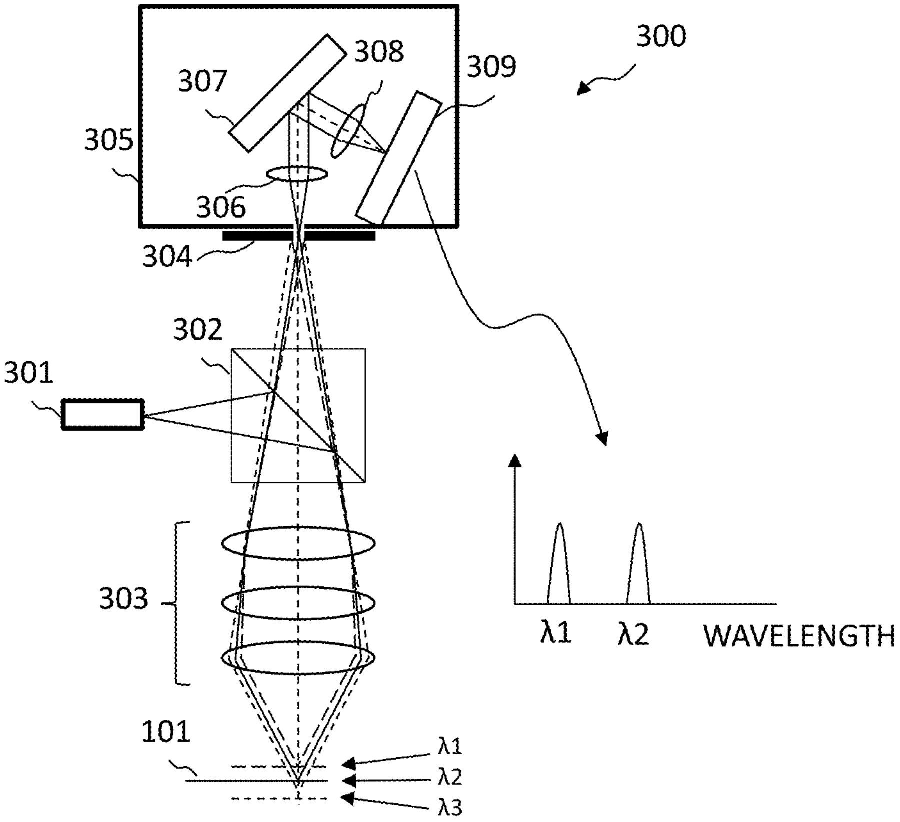
FIG. 16 is an illustration showing an example of a mark position measurement apparatus according to a modified example of the first embodiment.

FIG. 16 is an illustration showing an example of a mark position measurement apparatus according to a modified example of the first embodiment. FIG. 16 shows the case where, for example, a white confocal displacement sensor 300 is used as a mark position measurement apparatus. In the white confocal displacement sensor 300, continuous wavelength lights emitted from a light source 301 are reflected by a half mirror 302, refracted by an optical system 303, and applied to the target object 101 being an examination object. In this process, by designing the optical system 303 to generate an axial chromatic aberration, a focus is formed, for each wavelength, on a position shifted each other (each position in a height-wise direction) on the optical axis. FIG. 16 shows, under the citation of three wavelengths (λ1, λ2, λ3) of illumination lights, a state in which λ2 (solid line) is exactly focused on the surface of the target object 101. The light reflected at the surface of the target object 101 passes through the optical system 303, transmits through the half mirror 302, and reaches an aperture substrate 304 which is arranged in front of a spectroscope 305 and has a pinhole formed therein. At this time, only lights having been focused on the surface of the target object 101 are collected at the pinhole position and pass therethrough. Since lights of the other wavelengths become blurred at the pinhole position without forming an intermediate image plane, no sufficient light passes therethrough. The lights having passed through are bent in a converging direction by a lens 306 in the spectroscope 305, dispersed by a diffraction grating 307, bent in a converging direction by a lens 308, and imaged (focused) on a light receiving sensor 309. By utilizing that the imaged position on the light receiving sensor 309 changes depending on a wavelength, the height of the target object 101 can be detected. In the mark rough search step (S104), it is also preferable to use the white confocal displacement sensor 300, instead of the Z sensor 220, to measure the height position on the surface of the target object.

Figure 17:
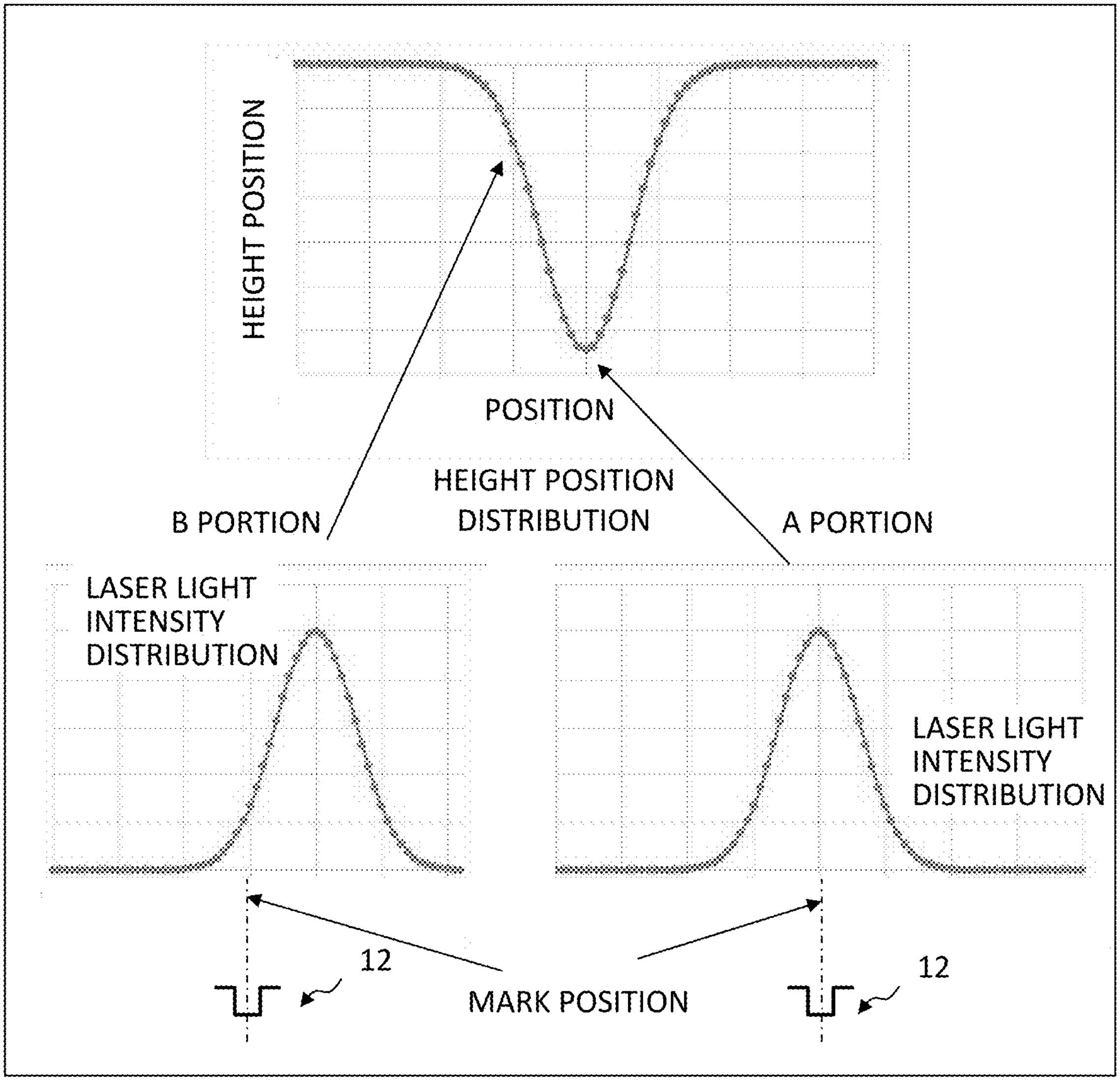
FIG. 17 is an illustration showing an example of a height position distribution of a concave-convex mark according to the first embodiment.

FIG. 17 is an illustration showing an example of a height position distribution of a concave-convex mark according to the first embodiment. In FIG. 17, the ordinate axis represents a height position and the abscissa axis represents a position (for example, a position in the x direction) on a target object. In the first embodiment, the laser beam 8 used by the Z sensor 220 has a light intensity distribution of normal distribution. If the laser beam 8 has a light intensity distribution, the reflected light 9 also has a light intensity distribution depending on the light intensity of the laser beam 8 being the original. The height position can be calculated by multiplying the light receiving position of the center of gravity position of the received reflected light 9 by a height conversion coefficient.

In the case of measuring the height position on the surface of the target object by using the white confocal displacement sensor 300, the height position can be calculated by multiplying the wavelength of the received reflected light by a height conversion coefficient. Needless to say, the height conversion coefficient to be multiplied by a measurement value of the Z sensor 220 is different from that to be multiplied by a measurement value of the white confocal displacement sensor 300. Hereinafter, the case of measuring using the Z sensor 220 is mainly described.

The center of gravity position of the reflected light 9 is affected by a light intensity of each light receiving position on the light receiving surface of the photoreceiver 224. Therefore, change of the center of gravity position can be made larger in the case of acquiring height information on the concave bottom by a portion with a high light intensity compared with the case of acquiring it by a portion with a low light intensity. Consequently, as shown in FIG. 17, when the small mark 14 (or large mark 12) having the line width W is located within the beam diameter of the laser beam 8, the height position changes depending on which position of the light intensity distribution positions irradiates the small mark 14 (or large mark 12) having the line width W. As shown in FIG. 17, the A portion of the height position shows the case where the small mark 14 (or large mark 12) is irradiated by the peak position (the maximum value of light intensity) of the light intensity of the laser beam 8. The B portion of the height position shows the case where the small mark 14 (or large mark 12) is irradiated by the position of, for example, around 20% light intensity of the light intensity peak position (the maximum value of light intensity) of the laser beam 8. As shown in FIG. 17, the higher the light intensity of a position to irradiate the small mark 14 (or large mark 12), the larger the change of the height position of the concave compared with the height position of the convex. If the light intensity distribution of the laser beam 8 is normal distribution, when the small mark 14 (or large mark 12) is irradiated by the peak position of the normal distribution, the height position of the concave is output as the lowest height position from the photoreceiver 224. Therefore, as shown in FIG. 17, the height position distribution of the surface of the target object 101 includes a portion which continuously changes in the same direction in a range larger than the width size of the small mark 14 (or large mark 12) (concave-convex mark), and which is generated due to a relative position relation between the light intensity distribution and the small mark 14 (or large mark 12) (concave-convex mark). At the left of the peak position of the height position distribution, it changes such that the height position continuously becomes lower toward the peak position from the height position of the convex. In contrast, at the right of the peak position of the height position distribution, it changes such that the height position continuously becomes higher toward the height position of the convex from the peak position.

According to the first embodiment, not only the case where the peak position indicates the upward maximum height position of a convex signal but also the case of indicating the downward minimum position of a concave signal is included. The peak position described herein indicates the downward minimum height position.

The height position distribution described above is calculated at each of the upper, lower, right, and left positions of the small mark 14 (or large mark 12).

In the mark candidate signal position calculation step (S108), the mark candidate signal position calculation unit 56 (position calculation unit) calculates, for each small mark 14 (or large mark 12) (concave-convex mark), a position of a mark candidate signal acquired in a scanned region, by using a height position distribution of the surface of the target object 101, which is for each small mark 14 (or large mark 12) (concave-convex mark) and obtained by scanning a laser beam over a plurality of small marks 14 (or large marks 12) (concave-convex marks) in a manner intersected with a small mark 14, etc. of the plurality of small marks 14 (or large marks 12) (concave-convex marks). The position of a mark candidate signal is represented, for each small mark 14 (or large mark 12) (concave-convex mark), by either a concave signal or a convex signal obtained in a scanned region.

If the small mark 14 (or large mark 12) exists at each of the four corners of the target object 101, the position of a mark candidate signal acquired in a scanned region is calculated for each small mark 14 (or large mark 12) (concave-convex mark). Specifically, it operates as follows:

The mark candidate signal position calculation unit 56 inputs a height position distribution of each of the upper, lower, right, and left positions of the small mark 14 (or large mark 12) (concave-convex mark), as height information on the surface of the target object 101. Then, the mark candidate signal position calculation unit 56 calculates, using the height position distribution on the surface of the target object 101, a position of each mark candidate signal shown in a height position distribution measured at each position. If there are a plurality of mark candidate signals in the same scanning direction in each of height position distributions, obtained at the upper, lower, right, and left positions of the small mark 14 (or large mark 12) (concave-convex mark), the positions of all the mark candidate signals are calculated. Specifically, calculation is performed as follows:

The mark candidate signal position calculation unit 56 calculates, as a position of a mark candidate signal, a peak position of a normal distribution acquired by approximating a mark candidate signal, which is a portion of a height position distribution of the surface of the target object 101, by using a density function of normal distribution (hereinafter referred to as a normal distribution function).

Figure 18:
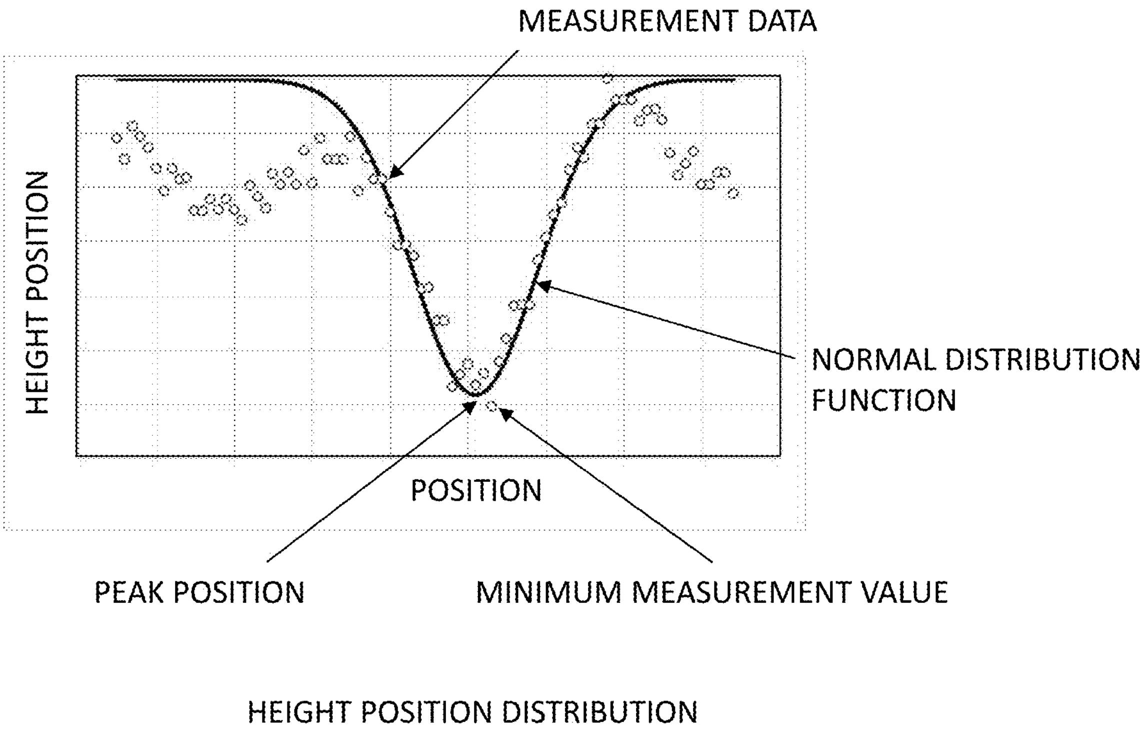
FIG. 18 is an illustration showing an example of a height position distribution according to the first embodiment.

FIG. 18 is an illustration showing an example of a height position distribution according to the first embodiment. In FIG. 18, the ordinate axis represents a height position and the abscissa axis represents a position. In FIG. 18, measurement data on a plurality of measurement positions in a scanning direction are plotted. By approximating the measurement data of the plurality of measurement positions in the scanning direction by a normal distribution function, the peak position of an approximate line is calculated as a position of a mark candidate signal.

Alternatively, it is also preferable that the mark candidate signal position calculation unit 56 calculates the center of gravity position of a height position distribution of the surface of the target object 101, and obtains the center of gravity position as a position of a mark candidate signal. The center of gravity position, g, can be calculated by the following equation (1) using a coordinate mi and a height position hi of measurement data. i indicates an index.

$$g=\Sigma(mi \cdot hi)/\Sigma hi \tag{1}$$

Alternatively, it is also preferable that the mark candidate signal position calculation unit 56 calculates, as a position of a mark candidate signal, the position of the minimum height measurement value of a height position distribution of the surface of the target object 101. The minimum height measurement value in measurement data on a plurality of measurement positions shown in FIG. 18 is calculated as a position of a mark candidate signal. Alternatively, since the direction of a signal becomes convex when a mark portion is convex, it is also preferable to calculate the position of the maximum height measurement value as a position of a mark candidate signal.

Using any of the above methods, an error of an acquired position of a mark candidate signal can be within an acceptable range.

The mark candidate signal position calculation unit 56 can obtain the x position (x coordinate) of the center of a mark candidate signal by calculating an average value between the x position measured at the upper position of the small mark 14 (or large mark 12) and the x position measured at the lower position of the small mark 14 (or large mark 12). Also, the y position (y coordinate) of the center of a mark candidate signal can be obtained by calculating an average value between the y position measured at the right position of the small mark 14 (or large mark 12) and the y position measured at the left position of the small mark 14 (or large mark 12). If a plurality of mark candidate signals are measured by scanning in the x direction, a plurality of x positions are acquired. In such a case, the x position (x coordinate) of the center of the plurality of mark candidate signals can be obtained. Also, if a plurality of mark candidate signals are measured by scanning in the y direction, a plurality of y positions are acquired. In such a case, the y position (y coordinate) of the center of the plurality of mark candidate signals can be obtained. Thus, by combining a plurality of x coordinates and a plurality of y coordinates, positions (x, y) of a plurality of mark candidate signals can be calculated.

In the combination generation step (S110), when a plurality of mark candidate signals are acquired in a scanning direction with respect to at least one of a plurality of small marks 14 (or large marks 12) (concave-convex marks), the combination generation unit 58 generates a plurality of combinations by combining mark candidate signals selected one by one from the plurality of small marks 14 (or large marks 12) (concave-convex marks).

Figure 19:
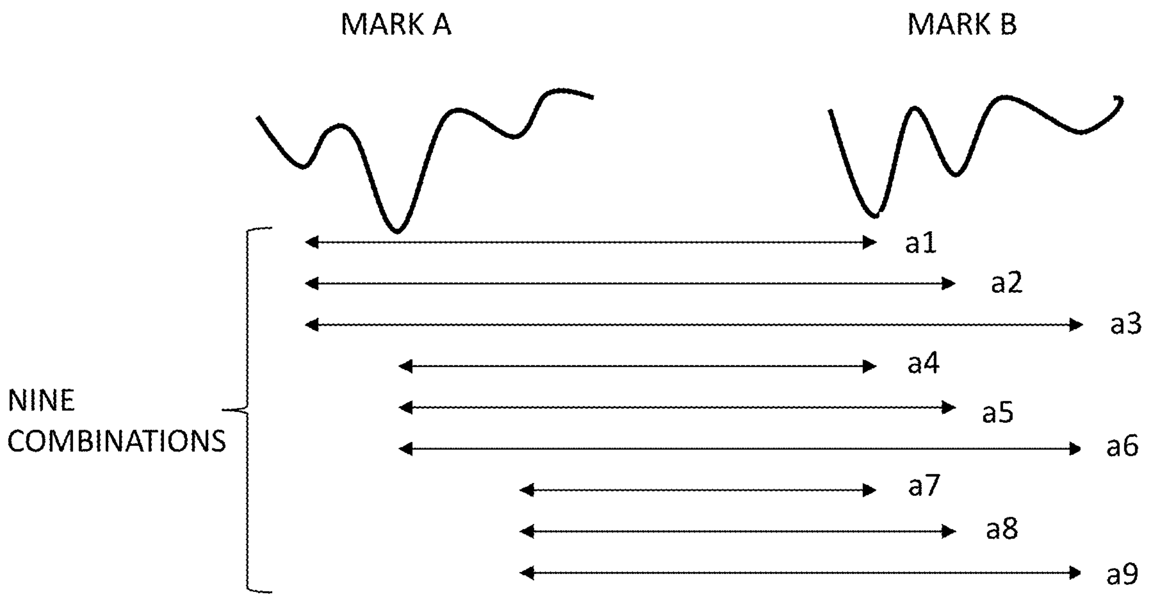
FIG. 19 is an illustration showing an example of a combination of mark candidate signals according to the first embodiment.

FIG. 19 is an illustration showing an example of a combination of mark candidate signals according to the first embodiment. FIG. 19 show the case where, for example, two small marks 14 (or large marks 12) (marks A and B) are scanned. In the case of FIG. 19, three mark candidate signals denoted by concave signals are measured for each mark. At this stage, it is still unknown which one of the measured three mark candidate signals with respect to the mark A is a true mark signal. Also, at this stage, it is still unknown which one of the measured three mark candidate signals with respect to the mark B is a true mark signal. Then, all the combinations are generated. Nine combinations are generated as follows: A combination a1 of the mark candidate signal on the left of the mark A and the mark candidate signal on the left of the mark B, a combination a2 of the mark candidate signal on the left of the mark A and the mark candidate signal at the center of the mark B, a combination a3 of the mark candidate signal on the left of the mark A and the mark candidate signal on the right of the mark B, a combination a4 of the mark candidate signal at the center of the mark A and the mark candidate signal on the left of the mark B, a combination a5 of the mark candidate signal at the center of the mark A and the mark candidate signal at the center of the mark B, a combination a6 of the mark candidate signal at the center of the mark A and the mark candidate signal on the right of the mark B, a combination a7 of the mark candidate signal on the right of the mark A and the mark candidate signal on the left of the mark B, a combination a8 of the mark candidate signal on the right of the mark A and the mark candidate signal at the center of the mark B, and a combination a9 of the mark candidate signal on the right of the mark A and the mark candidate signal on the right of the mark B.

In the relative position information (distance/angle) calculation step (S112), the relative position information calculation unit 60 calculates relative position information between positions of the mark candidate signals in the same combination.

The relative position information includes a distance between positions of mark candidate signals, and an angle between two straight lines each connecting positions of two mark candidate signals, while treating one position of them as being common, in three mark candidate signals.

Figure 20:
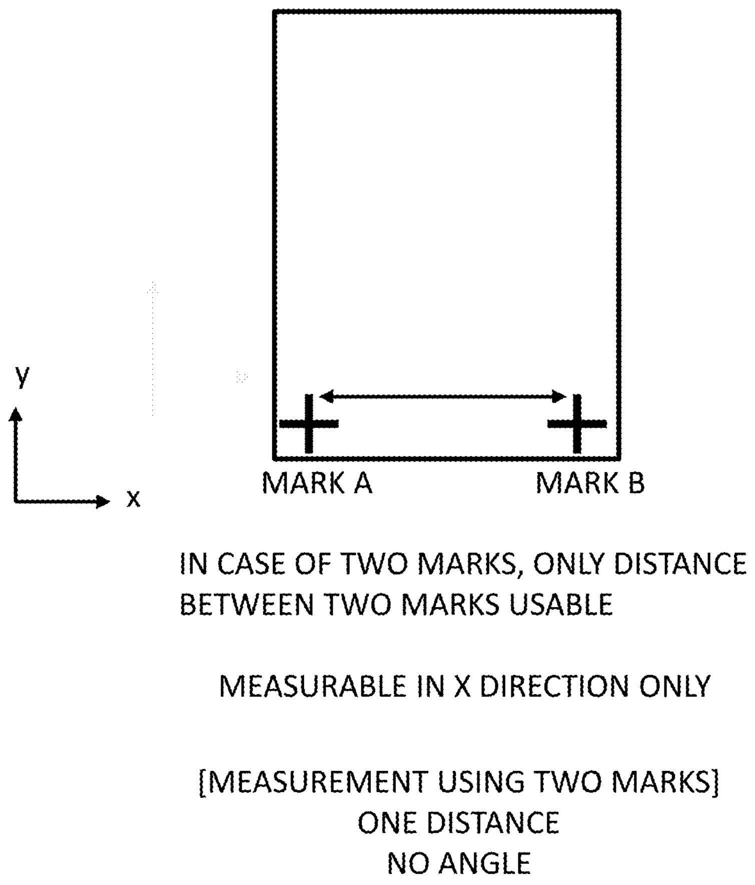
FIG. 20 is an illustration showing an example of the case where two alignment marks are arranged on a target object according to the first embodiment.

FIG. 20 is an illustration showing an example of the case where two alignment marks are arranged on a target object according to the first embodiment. When there are two alignment marks A and B, each combination is configured by two mark candidate signals. In such a case, the relative position information calculation unit 60 calculates a distance between positions of mark candidate signals in the same combination with respect to a plurality of combinations of the marks A and B. Therefore, if there are n combinations, n distances are calculated.

Figure 21:
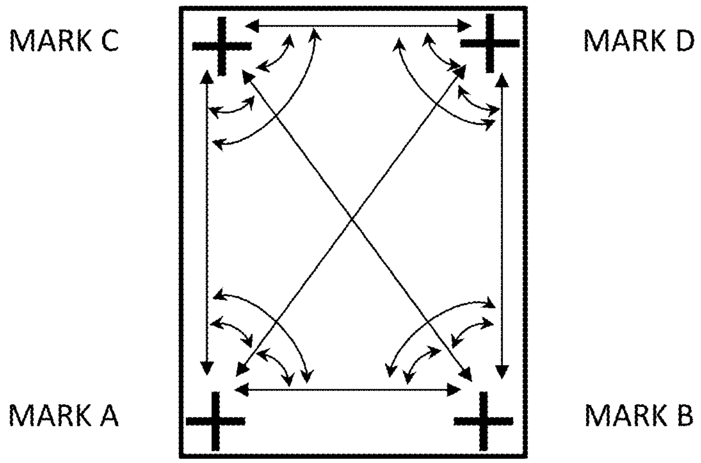
FIG. 21 is an illustration showing an example of the case where three or more alignment marks are arranged on a target object according to the first embodiment.

FIG. 21 is an illustration showing an example of the case where three or more alignment marks are arranged on a target object according to the first embodiment. FIG. 21 shows the case where there are, for example, four alignment marks A, B, C, and D on the target object 101. If there are three alignment marks A, B, and C on the target object 101, each combination is configured by three mark candidate signals. As shown in FIG. 21, when there are four alignment marks A, B, C, and D, each combination is configured by four mark candidate signals. In such a case, the relative position information calculation unit 60 calculates a distance between positions of mark candidate signals in the same combination. If, for example, three alignment marks are arranged on the target object 101, three distances are calculated per combination. Therefore, when there are n combinations, 3n distances are calculated. If there are four alignment marks, six distances are calculated per combination. Therefore, when there are n combinations, 6n distances are calculated. Calculated distances are stored, in relation to a combination identifier, in the storage device 142.

The relative position information calculation unit 60 calculates an angle between two straight lines each connecting positions of two mark candidate signals, while treating one position of them as being common, in three mark candidate signals in the same combination. For example, an angle θ between a straight line connecting mark candidate signals with respect to the marks A and B and a straight line connecting mark candidate signals with respect to the marks A and C is calculated while treating the position of the mark candidate signal of the mark A as being common. If, for example, three alignment marks are arranged on the target object 101, three angles are calculated per combination. Therefore, when there are n combinations, 3n angles are calculated. If there are four alignment marks, twelve angles are calculated per combination. Therefore, when there are n combinations, 12n angles are calculated. Calculated angles are stored, in relation to a combination identifier, in the storage device 142.

In the mark selection (rough detection) step (S114), the selection unit 66 selects a combination of mark candidate signals, which are mark signals of a plurality of marks, from a plurality of combinations, by comparing, with a predetermined reference value, relative position information regarding mark candidate signals in the same combination in a plurality of combinations. It is preferable to use a design value as the reference value. Specifically, the selection unit 66 selects a combination of mark candidate signals serving as mark signals of a plurality of small marks 14 (or large marks 12) (concave-convex marks) from a plurality of combinations, by comparing, with a design value, at least one of a distance between positions of mark candidate signals in the same combination, and an angle between two straight lines each connecting positions of two mark candidate signals, while treating one position of them as being common, in three mark candidate signals in the same combination. Then, the selection unit 66 outputs the position of each mark candidate signal configuring a selected combination, as a position of a mark signal.

When scanning over two small marks 14 (or large marks 12) (concave-convex marks) as a plurality of small marks 14 (or large marks 12) (concave-convex marks), the selection unit 66 selects, by comparing distances, a combination of mark candidate signals serving as mark signals of the two small marks 14 (or large marks 12) (concave-convex marks) from a plurality of combinations.

Alternatively, when scanning over three or more small marks 14 (or large marks 12) (concave-convex marks) as a plurality of small marks 14 (or large marks 12) (concave-convex marks), the selection unit 66 selects, by comparing both distances and angles, a combination of mark candidate signals serving as mark signals of the three or more small marks 14 (or large marks 12) (concave-convex marks) from a plurality of combinations.

Therefore, the index calculation unit 64 calculates a distance index for comparing distances, and an angle index for comparing angles.

For example, when a plurality of distances are calculated for each combination, a sum of squares of a difference between a measured distance and a distance design value is calculated as a distance index, for example. It is preferable to increase the priority along with a decrease in the distance index, namely, the smallest distance index has the highest priority. Also, when a plurality of angles are calculated for each combination, a sum of squares of a difference between a measured angle and an angle design value is calculated as an angle index, for example. It is preferable to increase the priority along with a decrease in the angle index, namely, the smallest angle index has the highest priority.

Alternatively, when a plurality of distances are calculated for each combination, it is preferable to increase the priority along with a decrease in a statistical value, such as an average, median, minimum, or maximum value of a difference between a measured distance and a distance design value. Also, when a plurality of angles are calculated for each combination, it is preferable to increase the priority along with a decrease in a statistical value, such as an average, median, minimum, or maximum value of a difference between a measured angle and an angle design value.

FIG. 22 is an illustration of an example of a table showing a combination priority according to the first embodiment. In FIG. 22, with respect to a combination a1, the distance index is b1 and the angle index is c1. With respect to a combination a2, the distance index is b1 and the angle index is c2. With respect to a combination a3, the distance index is b2 and the angle index is c3. With respect to a combination a4, the distance index is b3 and the angle index is c3. With respect to a combination an, the distance index is bm and the angle index is ck. In FIG. 22, distance indices are b1, b2, b3, . . . , and bm in an ascending order from the smallest, and angle indices are c1, c2, c3, . . . , and ck in an ascending order from the smallest. In that case, the combination a1, being the closest combination to the design value, has a priority 1 (the first priority). The combination a2, being the second closest combination to the design value, has a priority 2 (the second priority). The combination a3, being the third closest combination to the design value, has a priority 3 (the third priority). The combination a4, being the fourth closest combination to the design value, has a priority 4 (the fourth priority). In the example of FIG. 22, distance indices are aligned in an ascending order from the smallest. Then, if the distance indices are the same, the angle indices are aligned in an ascending order from the smallest. It is not limited thereto. For example, angle indices are aligned in an ascending order from the smallest, and if the angle indices are the same, the distance indices may be aligned in an ascending order from the smallest.

In the case of scanning over two small marks 14 (or large marks 12) (concave-convex marks), since no angle information is acquired, the priority of each combination is determined such that the priority increases as the distance becomes closer to the design value.

With respect to a plurality of combinations, the selection unit 66 gives a priority sequentially to a combination in which at least one of the distance and the angle is closer to the design value, one by one starting from the closest, and selects a combination with a higher priority, one by one starting from the highest, in the plurality of combinations. In the case of FIG. 22, the combination a1 of the priority 1 is selected.

Although, in the examples described above, the position is calculated for all the measured mark candidate signals to make them be elements of combinations, it is not limited thereto. For example, the mark candidate signal position calculation unit 56 approximates a plurality of mark candidate signals by using a normal distribution which employs the same parameter as that used in another normal distribution having previously been used for a target object with the same configuration of the small mark 14 (or large mark 12) (concave-convex mark) formed. Then, the combination generation unit 58 generates a plurality of combinations excluding mark candidate signals which have not been approximated because of unmatched distribution shapes. Thereby, the number of mark candidate signals can be narrowed down. Consequently, the load of calculation processing can be reduced and the processing time can be shortened.

As described above, the center position of an alignment mark (here, the small mark 14) can be measured by the Z sensor 220. Thus, even when a plurality of mark candidate signals are measured close to a concave-convex mark, it is possible to highly accurately select and detect the signal of the true mark in a plurality of mark candidate signals. Next, the center position of an alignment mark is measured, with high accuracy, using an electron beam. Specifically, using information on the position of each mark candidate signal configuring a combination selected in the mark selection (rough detection) step (S114), in the state in which the XY stage 105 has been moved to a position where the small mark 14 (concave-convex mark) can be irradiated with an electron beam, the position of the small mark 14 (concave-convex mark) is measured by scanning an electron beam over the small mark 14 (concave-convex mark).

In the mark scan step (S120), first, using information on the position of each concave-convex mark configuring a combination selected in the mark selection (rough detection) step (S114), the XY stage 105 is moved to a position where the small mark 14 (concave-convex mark) can be irradiated with an electron beam. Then, in the state in which the XY stage 105 has been moved to the position where the small mark 14 (concave-convex mark) can be irradiated with an electron beam, scanning over the small mark 14 (concave-s mark) is performed by deflecting an electron beam by the deflector 209. For example, as described above with reference to FIG. 11, the upper, lower, right, and left positions of the small mark 14 are scanned. However, here, it is sufficient to perform scanning in the range of 20-30 μm in the measurement direction, for example. Thus, compared with a conventional case, the range scanned by an electron beam can be substantially reduced. As an electron beam used for this scanning, it is preferable to use one beam selected from the multiple beams 20, or use several beams including the selected beam and beams adjacent to the selected beam. As the processing of beam selection, it is set such that selected beam (or beams) is made to be ON and the other beams (beam array) are made to be OFF by the blanking aperture mechanism 204.

Secondary electrons emitted from the target object when the small mark 14 (concave-convex mark) was scanned are detected by the detector 226. Detected data is converted into digital data from analog data by the detector 226 and is amplified to be output from the detector 226 to the control computer 110.

In the mark position calculation (fine detection) step (S122), the mark position calculation unit 68 calculates the center position of the small mark 14 (concave-convex mark) by using secondary electron image data, obtained at each of the upper, lower, right, and left positions of the small mark 14, generated based on a second electron in the mark scan step (S120). For example, both the edge positions which configure each of a vertical line width and a lateral line width of the small mark 14 in a secondary electron image are measured. Then, an average value of the center positions of vertical line widths and an average value of the center positions of lateral line widths are obtained as x and y coordinates of the small mark 14.

According to the first embodiment, by performing a fine search using an electron beam after performing a rough search using a laser beam by which no resist or a negligible level of resist may be dispersed, the region scanned with electron beams can be reduced. Since an approximate position of the small mark 14 has already been known by a rough search, it is possible to acquire, with an electron beam, the concave-convex configuration of the small mark 14 even when a concave-convex mark is made of the same material. Therefore, resist dispersion can be prevented or reduced. Further, even when increasing an incident dose amount (dose) of an electron beam, resist dispersion can be reduced.

In the determination step (S126), first, the relative position information calculation unit 60 calculates a distance between calculated positions of a plurality of small marks 14. Also, the relative position information calculation unit 60 calculates an angle between two straight lines each connecting two positions of small marks, while treating one position of them as being common, in a plurality of calculated small marks 14. Then, the determination unit 69 compares a calculated distance with a distance design value, and determines whether a comparison result difference (or a sum of squares of a comparison result difference) is within a threshold. Also, the determination unit 69 compares a calculated angle with an angle design value, and determines whether a comparison result difference (or a sum of squares of a comparison result difference) is within a threshold. If the difference exceeds the threshold, it is treated as an error. Then, it returns to the mark selection step (S114), and selects a combination with a next priority. Until the difference (or a sum of squares of the difference) is determined to be within the threshold, each step from the mark selection step (S114) to the determination step (S126) is repeated.

As described above, highly accurate x and y coordinates of the small mark 14 serving as an alignment mark are obtained.

With respect to the large mark 12 and the small mark 14, a mark opposite to the one described above can also be used. What is necessary is just to properly use marks in each step according to a required accuracy, a configured mark kind, or the number. Although, in the above examples, the case of using a concave alignment mark is described, the case of using a convex alignment mark may also be applied. In that case, the direction of a concavo-convex signal detected as a mark candidate signal is reversed.

Figure 23:
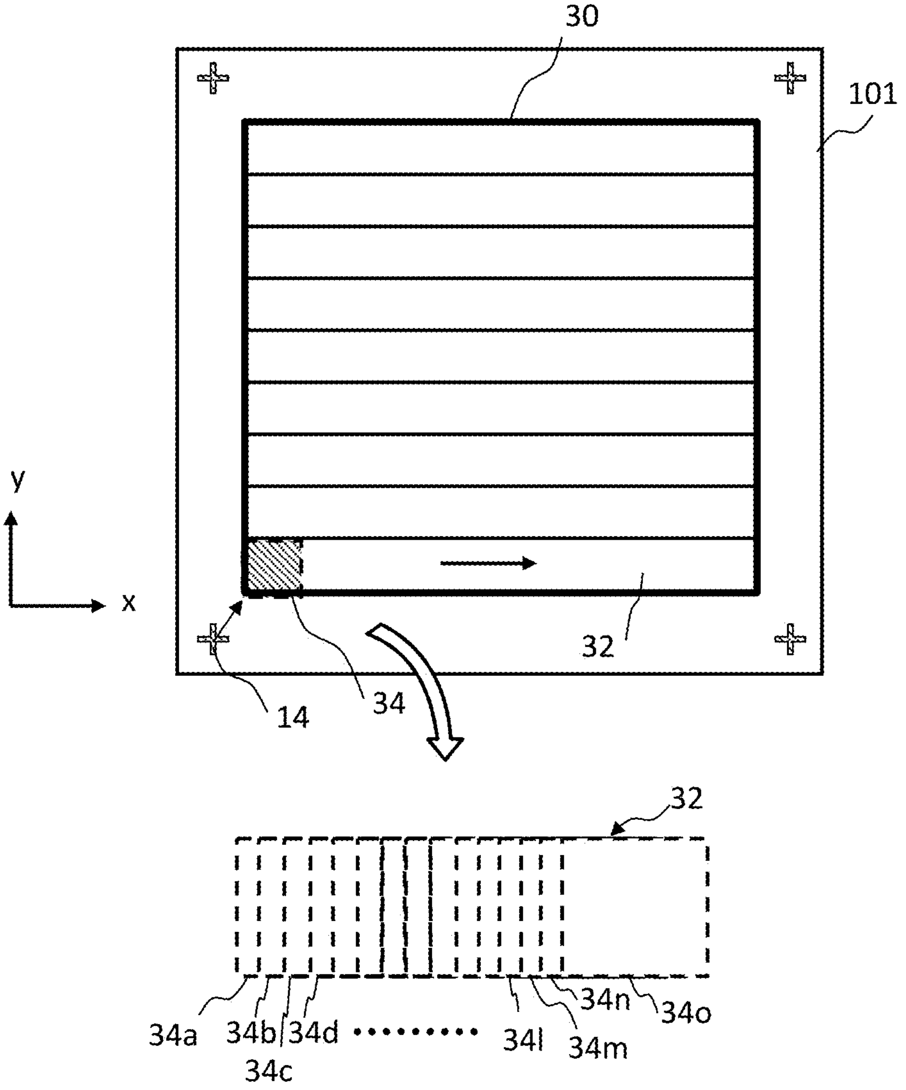
FIG. 23 is a conceptual diagram showing an example of a writing operation according to the first embodiment.

FIG. 23 is a conceptual diagram showing an example of a writing operation according to the first embodiment. As shown in FIG. 23, the position of the writing region 30 (bold line) of the target object 101 is defined based on an acquired position of the small mark 14 serving as an alignment mark, for example. The writing region 30 (bold line) is virtually divided into a plurality of stripe regions 32 by a predetermined width in the y direction, for example. In the case of FIG. 23, the writing region 30 of the target object 101 is divided into the plurality of stripe regions 32 by the width size being substantially the same as the design size of an irradiation region 34 (writing field) which can be irradiated by one irradiation with the multiple beams 20. The x-direction design size of the irradiation region 34 of the multiple beams 20 can be defined by (the number of x-direction beams)×(x-direction beam pitch). The y-direction size of the rectangular irradiation region 34 can be defined by (the number of y-direction beams)×(y-direction beam pitch).

First, the XY stage 105 is moved to make an adjustment such that the irradiation region 34 of the multiple beams 20 is located at the left end, or at a position further left than the left end, of the first stripe region 32, and then writing of the first stripe region 32 is performed. When writing the first stripe region 32, the XY stage 105 is moved, for example, in the −x direction, so that the writing may relatively proceed in the x direction. The XY stage 105 is moved, for example, continuously at a constant speed. After writing the first stripe region 32, the stage position is moved in the −y direction by the width of the stripe region 32.

Next, an adjustment is made so that the irradiation region 34 of the multiple beams 20 can be located at the left end, or at a position further left than the left end, of the second stripe region 32. Then, writing of the second stripe region 32 is performed by moving the XY stage 105, for example, in the −x direction to proceed the writing relatively in the x direction.

FIG. 23 shows the case where respective stripe regions 32 are written in the same direction, but, it is not limited thereto. For example, with respect to the stripe region 32 to be written following the stripe region 32 having been written in the x direction, it may be written in the −x direction by moving the XY stage 105 in the x direction, for example. Thus, the stage moving time can be reduced by performing writing while alternately changing the writing direction, which results in reducing the writing time. A plurality of shot patterns maximally up to as many as the number of the holes 22 are formed at a time by one shot of multiple beams 20 having been formed by individually passing through the holes 22 in the shaping aperture array substrate 203.

Although FIG. 23 shows the case where the stage moving for writing each stripe region is performed once for each writing, it is not limited thereto. It is also preferable to perform multiple writing such that the stage moves on the same position a plurality of times. In that case, it is preferable to perform multiple writing while shifting the position in the y direction by the displacement amount of 1/n of the width of the stripe region.

Figure 24:
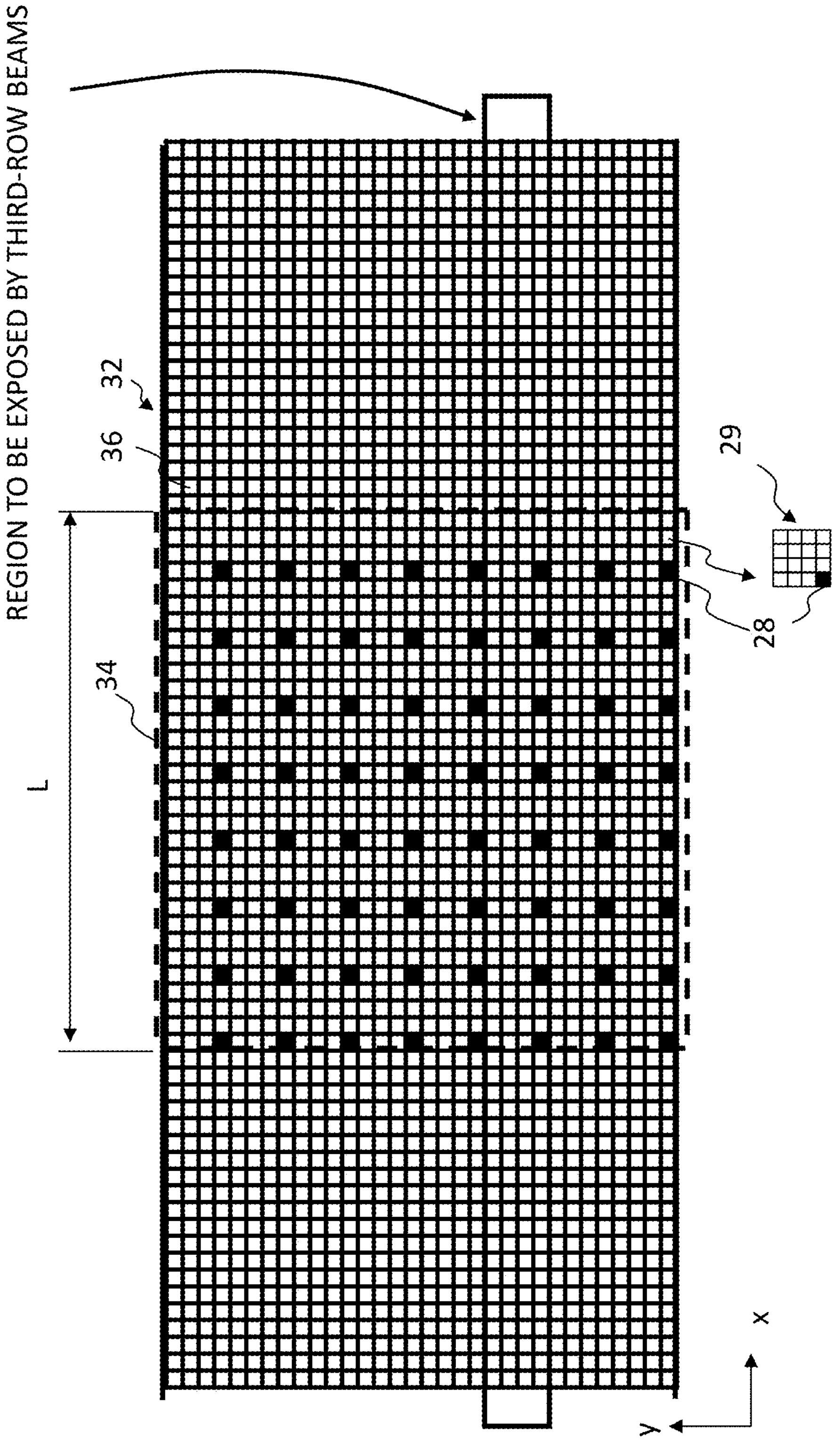
FIG. 24 is an illustration showing an example of an irradiation region of multiple beams and a writing target pixel according to the first embodiment.

FIG. 24 is an illustration showing an example of an irradiation region of multiple beams and a pixel to be written (writing target pixel) according to the first embodiment. In FIG. 24, the stripe region 32 is divided into a plurality of mesh regions by the beam size of each of the multiple beams 20, for example. Each mesh region serves as a writing pixel 36 (unit irradiation region, irradiation position, or writing position). The size of the writing pixel 36 is not limited to the beam size, and may be any size regardless of the beam size. For example, it may be 1/n (n being an integer of 1 or more) of the beam size. FIG. 24 shows the case where the writing region of the target object 101 is divided, for example, in the y direction, into a plurality of stripe regions 32 by the width size being substantially the same as the size of the irradiation region 34 (writing field) which can be irradiated by one irradiation of the multiple beams 20. The x-direction size of the rectangular, including square, irradiation region 34 can be defined by (the number of x-direction beams)×(beam pitch in the x direction). The y-direction size of the rectangular irradiation region 34 can be defined by (the number of y-direction beams)×(beam pitch in the y direction). FIG. 24 shows the case of multiple beams of 512×512 (rows×columns) being simplified to 8×8 (rows×columns). In the irradiation region 34, there are shown a plurality of pixels 28 (beam writing positions) which can be irradiated with one shot of the multiple beams 20. The pitch between adjacent pixels 28 is the beam pitch of the multiple beams. A sub irradiation region 29 (pitch cell) is configured by a rectangular, including square, region surrounded by the size of beam pitches in the x and y directions. In the example of FIG. 24, each sub irradiation region 29 is composed of 4×4 pixels, for example.

In the shot data generation step (S130), first, the shot data generation unit 70 generates shot data for each pixel 36. Specifically, it operates as follows: First, the shot data generation unit 70 reads writing data from the storage device 140, and calculates, for each pixel 36, a pattern area density ρ' in the pixel 36 concerned. This processing is performed for each stripe region 32, for example.

Next, the shot data generation unit 70, first, virtually divides the writing region (here, for example, stripe region 32) into a plurality of proximity mesh regions (mesh regions for proximity effect correction calculation) by a predetermined size. The size of the proximity mesh region is preferably about 1/10 of the influence range of the proximity effect, such as about 1 μm. The shot data generation unit 70 reads writing data from the storage device 140, and calculates, for each proximity mesh region, a pattern area density ρ" of a pattern arranged in the proximity mesh region concerned.

Next, the shot data generation unit 70 calculates, for each proximity mesh region, a proximity effect correction irradiation coefficient Dp(x) (correction dose) for correcting a proximity effect. An unknown proximity effect correction irradiation coefficient Dp(x) can be defined by a threshold value model for proximity effect correction, which is the same as the one used in a conventional method, where a backscatter coefficient η, a dose threshold value Dth of a threshold value model, a pattern area density ρ", and a distribution function g(x) are used.

Next, the shot data generation unit 70 calculates, for each pixel 36, an incident dose D(x) (amount of dose) with which the pixel 36 concerned is irradiated. The incident dose D(x) can be calculated, for example, by multiplying a base dose Dbase by a proximity effect correction irradiation coefficient Dp and a pattern area density ρ'. The base dose Dbase can be defined by Dth/(½+η), for example. Thereby, it is possible to obtain an incident dose D(x) for each pixel 36, for which a proximity effect has been corrected, based on layout of a plurality of figure patterns defined by the writing data.

Next, the shot data generation unit 70 calculates an irradiation time for each pixel 36. The irradiation time for each pixel 36 can be obtained by diving an incident dose D(x) of the pixel concerned by a current density J.

In the data processing step (S132), the data processing unit 72 rearranges obtained irradiation time data for each pixel 36 in order of shot, and stores it in the storage device 142. The transmission processing unit 74 transmits, in order of shot, the irradiation time data to the deflection control circuit 130.

In the writing step (S140), under the control of the writing control unit 76, the writing mechanism 150 writes, with the multiple beams 20, a pattern on the target object 101 on the XY stage 105 while moving the XY stage 105. In the multiple beam writing, in parallel with performing the writing processing, the writing mechanism 150 generates shot data for a region in which later writing processing is to be performed. For example, while writing the k-th stripe region 32, shot data for the k+2 stripe region 32 is generated in parallel. Repeating this operation, all the stripe regions 32 are written.

Figure 25:
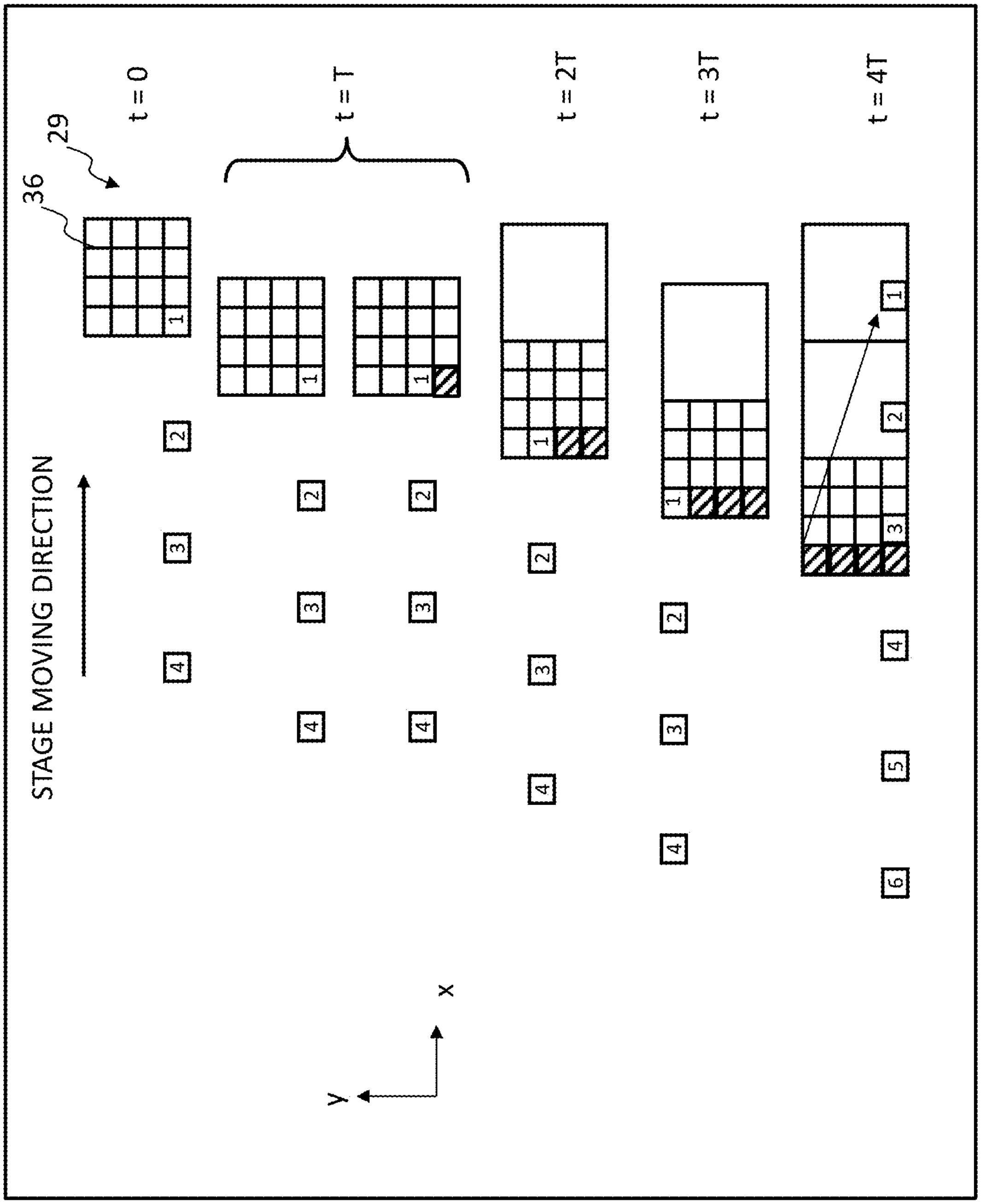
FIG. 25 is an illustration explaining an example of a multi-beam writing operation according to the first embodiment.

FIG. 25 is an illustration explaining an example of a multi-beam writing operation according to the first embodiment. FIG. 25 shows the case where the inside of each sub-irradiation region 29, which includes the beam irradiation position of one of the multiple beams 20 and is surrounded with the beam pitch (pitch between beams), is written with four different beams. The example of FIG. 25 shows a writing operation where the XY stage 105 continuously moves at the speed at which the XY stage 105 moves the distance of two beam pitches while a ¼ region, namely the region of 1/(the number of beams used for irradiation), in each sub-irradiation region 29 is written. FIG. 25 shows the case where each sub irradiation region 29 is composed of 4×4 pixels, for example.

In the writing operation shown in FIG. 25, for example, while the XY stage 105 moves the distance of two beam pitches in the x direction, respective four pixels 36 in the same sub-irradiation region 29 are written (exposed) by applying four shots of the multiple beams 20 at a shot cycle T with shifting the irradiation position (pixel 36) in order by the deflector 209. In order that the relative position between the irradiation region 34 and the target object 101 may not be shifted by the movement of the XY stage 105 while these four pixels are written (exposed), the irradiation region 34 is made to follow the movement of the XY stage 105 by collective deflection of all of the multiple beams 20 by the deflector 208. In other words, a tracking control is performed. After one tracking cycle is completed, tracking is reset to return to the previous (last) tracking starting position. Since writing of the pixels in the first column from the left of each sub-irradiation region 29 has been completed, in the next tracking cycle after resetting the tracking, first, the deflector 209 provides deflection such that the writing position of a beam which is different from that used for the first pixel column is adjusted (shifted) to write the second pixel column from the left still not having been written in each sub-irradiation region 29, for example. By repeating this operation during writing the stripe region 32, as shown in the lower part of FIG. 25, the position of the irradiation region 34 (34*a* to 34*o*) is sequentially moved (shifted) to perform writing.

As described above, according to the first embodiment, a concave-convex mark whose concave (recessed) surface and convex (projected) surface are made of the same material can be specified highly accurately in a plurality of detection signals, and thus to be detected. Further, according to the first embodiment, even when a plurality of mark candidate signals are measured due to an influence of a configuration in the vicinity of the mark except for itself, of resist unevenness, a noise or the like, it is possible to highly accurately select and detect a true mark signal in the plurality of mark candidate signals.

As described above, according to the first embodiment, a desired mark can be specified in detection signals of a plurality of marks formed on the target object.

Embodiments have been explained referring to specific examples described above. However, the present invention is not limited to these specific examples. For example, in the above example, a case has been described in which uneven marks on the same material are measured, but the cases to which the present invention is applied are not limited to this, and may be a case in which marks whose mark portions are made of different materials are measured. Note that the present technique can be used not only for measurement with a z sensor but also measurement with other sensors such as a white confocal displacement sensor.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

Further, any position measurement apparatus, charged particle beam writing apparatus, and mark position measurement method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mark position measurement apparatus comprising:

a stage configured to be movable and place thereon a target object on which a plurality of marks have been formed;

a sensor configured to include an irradiator which irradiates the target object with a laser beam, and a photoreceiver which receives a reflected light from the target object irradiated with the laser beam and outputs a height position distribution of a surface of the target object;

a position calculation circuit configured to calculate, for each mark of the plurality of marks, a position of a mark candidate signal acquired in a scanned region, by using the height position distribution of the surface of the target object which is for the each mark and obtained by scanning the laser beam over the plurality of marks in a manner intersected with a mark of the plurality of marks;

a combination generation circuit configured to generate a plurality of combinations by combining mark candidate signals selected one by one from the plurality of marks in a case where a plurality of mark candidate signals are acquired in a scanning direction with respect to at least one of the plurality of marks; and a selection circuit configured to select a combination of mark candidate signals, which are mark signals of the plurality of marks, from the plurality of combinations, by comparing, with a predetermined reference value, relative position information regarding mark candidate signals in a same combination in the plurality of combinations.

2. The apparatus according to claim 1, wherein a distance is used as the relative position information.

3. The apparatus according to claim 1, wherein an angle is used as the relative position information.

4. The apparatus according to claim 1, wherein, with respect to the plurality of combinations, the selection circuit gives a priority sequentially to a combination in which at least one of a distance and an angle, as the relative position information, is closer to the predetermined reference value, one by one starting from closest, and selects a combination with a higher priority, one by one starting from highest, in the plurality of combinations.

5. The apparatus according to claim 1, wherein a design value is used as the predetermined reference value.

6. The apparatus according to claim 1, wherein the laser beam is scanned over at least two marks as the plurality of marks, and the selection circuit selects, by comparing distances as the relative position information, a combination of mark candidate signals serving as mark signals of the at least two marks from the plurality of combinations.

7. The apparatus according to claim 1, wherein the laser beam is scanned over at least three marks as the plurality of marks, and the selection circuit selects, by comparing both distances and angles as the relative position information, a combination of mark candidate signals serving as mark signals of the at least three marks from the plurality of combinations.

8. The apparatus according to claim 1, wherein the position calculation circuit calculates, by using a normal distribution function, a peak position of a normal distribution acquired by approximating a mark candidate signal, which is a portion of the height position distribution, as a position of the mark candidate signal concerned, the position calculation circuit approximates the plurality of mark candidate signals by using a normal distribution which employs a same parameter as that used in another normal distribution having previously been used for a target object with a same mark configuration formed, and the combination generation circuit generates the plurality of combinations excluding mark candidate signals which have not been approximated because of unmatched distribution shapes.

9. A charged particle beam writing apparatus comprising:

the mark position measurement apparatus according to claim 1; and a writing mechanism configured to write a pattern, using a charged particle beam, on the target object placed on the stage.

10. A mark position measurement method comprising:

irradiating, using a sensor including an irradiator and a photoreceiver, while moving a target object, with a plurality of marks formed thereon, placed on a stage, the target object with a laser beam by the irradiator, receiving by the photoreceiver a reflected light from the target object irradiated with the laser beam, and outputting a height position distribution of a surface of the target object;

calculating, for each mark of the plurality of marks, a position of a mark candidate signal acquired in a scanned region, by using the height position distribution of the surface of the target object, which is for the each mark and obtained by the sensor by scanning the laser beam over the plurality of marks in a manner intersected with a mark of plurality of marks;

generating a plurality of combinations by combining mark candidate signals selected one by one from the plurality of marks in a case where a plurality of mark candidate signals are acquired in a scanning direction with respect to at least one of the plurality of marks; and selecting a combination of mark candidate signals, which are mark signals of the plurality of marks, from the plurality of combinations, by comparing, with a predetermined reference value, relative position information regarding mark candidate signals in a same combination in the plurality of combinations, and outputting, as a position of a mark signal, a position of each mark candidate signal configuring the combination selected.

11. The method according to claim 10, wherein a distance is used as the relative position information.

12. The method according to claim 10, wherein an angle is used as the relative position information.

13. The method according to claim 10, wherein, with respect to the plurality of combinations, a priority is sequentially given to a combination in which, as the relative position information, at least one of a distance and an angle is closer to the predetermined reference value, one by one starting from closest, and a combination with a higher priority is selected, one by one starting from highest, in the plurality of combinations.

14. The method according to claim 10, wherein a design value is used as the predetermined reference value.

15. The method according to claim 10, wherein the laser beam is scanned over at least two marks as the plurality of marks, and a combination of mark candidate signals serving as mark signals of the at least two marks is selected from the plurality of combinations by comparing distances as the relative position information.

16. The method according to claim 10, wherein the laser beam is scanned over at least three marks as the plurality of marks, and a combination of mark candidate signals serving as mark signals of the at least three marks is selected from the plurality of combinations by comparing both distances and angles as the relative position information.

17. The method according to claim 10, wherein a peak position of a normal distribution acquired by approximating a mark candidate signal, which is a portion of the height position distribution, is calculated as a position of the mark candidate signal concerned by using a normal distribution function, the plurality of mark candidate signals are approximated by using a normal distribution which employs a same parameter as that used in another normal distribution having previously been used for a target object with a same mark configuration formed, and the plurality of combinations are generated excluding mark candidate signals which have not been approximated because of unmatched distribution shapes.

* * * * *